(12) United States Patent
Moiseev et al.

(10) Patent No.: US 9,151,786 B2
(45) Date of Patent: Oct. 6, 2015

(54) SYSTEMS, METHODS, AND APPARATUS FOR DETECTING SHIFTS IN REDUNDANT SENSOR SIGNALS

(75) Inventors: Alexander Alexandrovich Moiseev, Moscow (RU); Paul Jeffrey Mitchell, Greenville, SC (US); Mikhail Petrovich Vershinin, Moscow (RU); Elena Eduardovna Zyryanova, Moscow (RU)

(73) Assignee: General Electric Company, Schenectady, NY (US)

( * ) Notice: Subject to any disclaimer, the term of this patent is extended or adjusted under 35 U.S.C. 154(b) by 220 days.

(21) Appl. No.: 13/878,396

(22) PCT Filed: Oct. 11, 2010

(86) PCT No.: PCT/RU2010/000600
§ 371 (c)(1),
(2), (4) Date: Apr. 8, 2013

(87) PCT Pub. No.: WO2012/050474
PCT Pub. Date: Apr. 19, 2012

(65) Prior Publication Data
US 2013/0293217 A1 Nov. 7, 2013

(51) Int. Cl.
*G01R 25/00* (2006.01)
*G05B 9/03* (2006.01)
*G05B 23/02* (2006.01)

(52) U.S. Cl.
CPC *G01R 25/00* (2013.01); *G05B 9/03* (2013.01); *G05B 23/0227* (2013.01)

(58) Field of Classification Search
CPC ........ G01R 25/00; G01R 19/25; G05B 11/32; G05B 9/02; G05B 23/0297; G05B 19/4184; G05B 9/03
See application file for complete search history.

(56) References Cited

U.S. PATENT DOCUMENTS 3,028,085 A * 4/1962 Donan et al. ................. 708/673
3,422,327 A * 1/1969 Pearson, Jr. et al. ......... 318/563
(Continued)

FOREIGN PATENT DOCUMENTS

CN 1160467 A 9/1997
CN 1184931 A 6/1998
(Continued)

OTHER PUBLICATIONS

Yeh et al., "An Auto Calibration Scheme for Sensor Fusion", Multisensor Fusion and Integration for Intelligent Systems, 1994. IEEE International Conference, Lasvegas, USA, pp. 136-142, Oct. 2, 2014.

(Continued)

*Primary Examiner* — Patrick Assouad
*Assistant Examiner* — Suresh K Rajaputra
(74) *Attorney, Agent, or Firm* — Sutherland Asbill & Brennan LLP

(57) ABSTRACT

Certain embodiments of the invention may include systems, methods, and apparatus for detecting shifts in redundant sensor signals. According to an example embodiment of the invention, a method is provided for detecting and indicating a shift in redundant sensor signals. The method can include receiving a sensor channel closeness signal for two or more redundant sensors, receiving a spike confidence signal for at least one of the two or more redundant sensors, receiving a spike duration signal for the at least one of the two or more redundant sensors, determining a shift confidence based at least in part on the received sensor channel closeness signal, the received spike confidence signal, and the received spike duration signal, and outputting the shift confidence.

17 Claims, 20 Drawing Sheets

(56) References Cited

U.S. PATENT DOCUMENTS

| | | | |
|---|---|---|---|
| 3,590,378 A * | 6/1971 | Kassabgi | 324/537 |
| 3,596,107 A * | 7/1971 | Kittrell | 326/11 |
| 3,600,604 A * | 8/1971 | Thorne-Booth | 326/14 |
| 3,665,173 A * | 5/1972 | Bouricius et al. | 714/11 |
| 3,688,099 A * | 8/1972 | Buscher | 714/11 |
| 3,805,235 A * | 4/1974 | Foster et al. | 714/797 |
| 3,965,366 A * | 6/1976 | Sumida et al. | 307/39 |
| 4,096,989 A * | 6/1978 | Tawfik | 714/821 |
| 4,117,317 A * | 9/1978 | Dooley et al. | 714/820 |
| 4,130,241 A * | 12/1978 | Meredith et al. | 714/10 |
| 4,276,648 A * | 6/1981 | Tomlinson | 714/820 |
| 4,327,437 A * | 4/1982 | Frosch et al. | 714/3 |
| 4,345,327 A * | 8/1982 | Thuy | 714/797 |
| 4,472,806 A * | 9/1984 | Blair | 714/820 |
| 4,622,667 A * | 11/1986 | Yount | 714/11 |
| 4,654,582 A * | 3/1987 | Ito | 324/73.1 |
| 4,745,542 A * | 5/1988 | Baba et al. | 700/79 |
| 4,816,919 A * | 3/1989 | Coates | 348/353 |
| 4,916,612 A * | 4/1990 | Chin et al. | 701/3 |
| 5,032,827 A * | 7/1991 | Colleu et al. | 340/661 |
| 5,148,378 A * | 9/1992 | Shibayama et al. | 702/116 |
| 5,233,542 A * | 8/1993 | Hohner et al. | 702/199 |
| 5,233,638 A * | 8/1993 | Moriwaki et al. | 377/55 |
| 5,329,465 A * | 7/1994 | Arcella et al. | 702/184 |
| 5,402,520 A * | 3/1995 | Schnitta | 706/16 |
| 5,428,769 A * | 6/1995 | Glaser et al. | 700/4 |
| 5,469,447 A * | 11/1995 | Brunemann et al. | 714/797 |
| 5,548,539 A * | 8/1996 | Vlach et al. | 703/6 |
| 5,566,092 A * | 10/1996 | Wang et al. | 702/185 |
| 5,626,140 A | 5/1997 | Feldman et al. | |
| 5,668,603 A | 9/1997 | Copeland | |
| 5,706,278 A * | 1/1998 | Robillard et al. | 370/222 |
| 5,796,935 A * | 8/1998 | Morrison et al. | 714/11 |
| 5,809,220 A * | 9/1998 | Morrison et al. | 714/12 |
| 5,864,773 A * | 1/1999 | Barna et al. | 702/85 |
| 5,939,884 A * | 8/1999 | Goldfarb et al. | 324/322 |
| 5,961,567 A * | 10/1999 | Azzaro et al. | 701/99 |
| 6,027,239 A * | 2/2000 | Ghassaei | 700/279 |
| 6,216,243 B1* | 4/2001 | Wittrodt | 714/734 |
| 6,356,857 B1* | 3/2002 | Qin et al. | 702/185 |
| 6,397,114 B1* | 5/2002 | Eryurek et al. | 700/51 |
| 6,504,485 B2* | 1/2003 | Jinno et al. | 340/642 |
| 6,898,554 B2* | 5/2005 | Jaw et al. | 702/185 |
| 6,909,993 B2 | 6/2005 | Nakao et al. | |
| 6,973,396 B1* | 12/2005 | Shah et al. | 702/81 |
| 7,142,990 B2* | 11/2006 | Bouse et al. | 702/35 |
| 7,293,400 B2* | 11/2007 | Taware et al. | 60/39.27 |
| 7,353,140 B2* | 4/2008 | Daw et al. | 702/182 |
| 7,426,449 B2* | 9/2008 | Henry et al. | 702/127 |
| 7,495,612 B2* | 2/2009 | Smith | 342/450 |
| 7,568,000 B2* | 7/2009 | Keyes et al. | 709/200 |
| 7,706,931 B2* | 4/2010 | Peers | 701/2 |
| 7,738,043 B2* | 6/2010 | Honda | 348/607 |
| 7,770,098 B2* | 8/2010 | Kimura | 714/817 |
| 7,899,613 B2* | 3/2011 | Artini | 701/120 |
| 8,122,333 B2* | 2/2012 | Shim et al. | 714/800 |
| 8,510,594 B2* | 8/2013 | Paulsburg | 714/5.1 |
| 2001/0033471 A1 | 10/2001 | Morimoto et al. | 361/93.9 |
| 2002/0108457 A1* | 8/2002 | Berger et al. | 74/335 |
| 2003/0043942 A1* | 3/2003 | Ono | 375/347 |
| 2006/0224357 A1* | 10/2006 | Taware et al. | 702/179 |
| 2007/0067678 A1* | 3/2007 | Hosek et al. | 714/25 |
| 2007/0274167 A1* | 11/2007 | Ishikawa | 369/44.11 |
| 2008/0120060 A1* | 5/2008 | Kant et al. | 702/138 |
| 2008/0231262 A1* | 9/2008 | Wolf et al. | 324/207.2 |
| 2008/0272724 A1* | 11/2008 | Hayashi | 318/430 |
| 2008/0276155 A1* | 11/2008 | Shim et al. | 714/800 |
| 2010/0030556 A1* | 2/2010 | Tanaka et al. | 704/226 |
| 2011/0156800 A1* | 6/2011 | Lee et al. | 327/517 |
| 2013/0191681 A1* | 7/2013 | Moiseev et al. | 714/2 |
| 2013/0197849 A1* | 8/2013 | Moiseev et al. | 702/116 |
| 2013/0226492 A1* | 8/2013 | Moiseev et al. | 702/85 |
| 2013/0293217 A1* | 11/2013 | Moiseev et al. | 324/76.77 |
| 2013/0332085 A1* | 12/2013 | Yang et al. | 702/22 |

FOREIGN PATENT DOCUMENTS

| | | |
|---|---|---|
| CN | 1416076 A | 5/2003 |
| CN | 1563827 A | 1/2005 |
| CN | 1782672 A | 6/2006 |
| CN | 101237521 A | 8/2008 |
| CN | 101502006 A | 8/2009 |
| EP | 1650616 A2 | 4/2006 |
| JP | 05116056 A | 5/1993 |
| JP | 06167591 A | 6/1994 |
| JP | 08129691 A | 5/1996 |
| JP | 2003060540 A | 2/2003 |
| JP | 2003271231 A | 9/2003 |
| JP | 3461932 B2 | 10/2003 |
| JP | 2004020427 A | 1/2004 |
| JP | 2004234302 A | 8/2004 |
| JP | 2005339558 A | 12/2005 |
| JP | 2006105981 A | 4/2006 |
| JP | 2007053673 A | 3/2007 |
| JP | 2008198213 A | 8/2008 |
| JP | 2008216226 A | 9/2008 |
| JP | 2008276785 A | 11/2008 |
| JP | 2009025012 A | 2/2009 |
| JP | 2009043266 A | 2/2009 |
| JP | 2009135834 A | 6/2009 |
| JP | 2010041107 A | 2/2010 |
| JP | 2010505036 A | 2/2010 |
| WO | 2008098416 A1 | 8/2008 |
| WO | 2010032906 A1 | 3/2010 |

OTHER PUBLICATIONS

Mahajan et al., "Multisensor Integration and Fusion Model That Uses a Fuzzy Inference System", IEEE/ASME Transactions on Mechatronics, IEEE Service Center, vol. No. 6, Issue No. 2, Jun. 1, 2001.

PCT Search Report and Written Opinion issued in connection with PCT Application No. PCT/RU2010/000601 on Jun. 15, 2011.

PCT Search Report and Written Opinion issued in connection with PCT Application No. PCT/RU2010/000603 on Jun. 15, 2011.

PCT Search Report and Written Opinion issued in connection with PCT Application No. PCT/RU2010/000600 on Jun. 15, 2011.

PCT Search Report and Written Opinion issued in connection with PCT Application No. PCT/RU2010/000597 on Jun. 15, 2011.

PCT Search Report and Written Opinion issued in connection with PCT Application No. PCT/RU2010/000599 on Jun. 22, 2011.

PCT Search Report and Written Opinion issued in connection with PCT Application No. PCT/RU2010/000596 on Jun. 22, 2011.

PCT Search Report and Written Opinion issued in connection with PCT Application No. PCT/RU2010/000602 on Jul. 4, 2011.

Unofficial English Translation of Japanese Office Action issued in connection with JP Application No. 2013-533812 on Jul. 9, 2014.

Unofficial English Translation of Japanese Office Action issued in connection with JP Application No. 2013-533813 on Jul. 1, 2014.

Unofficial English Translation of Japanese Office Action issued in connection with JP Application No. 2013-533811 on Jul. 1, 2014.

Unofficial English Translation of Japanese Office Action issued in connection with JP Application No. 2013-533810 on Jul. 1, 2014.

Unofficial English translation of Office Action issued in connection with corresponding CN Application No. 201080069559.X on Nov. 4, 2014.

U.S. Appl. No. 13/878,398, filed Apr. 8, 2013, Moiseev, et al.
U.S. Appl. No. 13/878,393, filed May 1, 2013, Moiseev, et al.
U.S. Appl. No. 13/878,384, filed Apr. 8, 2013, Moiseev, et al.

Unofficial English Translation of Chinese Office Action issued in connection with corresponding CN Application No. 201080069549.6 on Nov. 15, 2014.

Unofficial English Translation of Chinese Office Action issued in connection with corresponding CN Application No. 201080069550.9 on Dec. 22, 2014.

Chinese Office Action dated Jul. 6, 2015 for Application No. CN 201080069563.6.

* cited by examiner

SYSTEMS, METHODS, AND APPARATUS FOR DETECTING SHIFTS IN REDUNDANT SENSOR SIGNALS

RELATED APPLICATIONS

This application is a national stage application, filed under 35 U.S.C. §371, of International Application No. PCT/RU2010/000600, filed Oct. 11, 2010, all of which is hereby incorporated by reference in its entirety.

This application is related to U.S. application Ser. No. 13/878,384, filed concurrently with the present application on Oct. 11, 2010, entitled: "Systems, methods, and apparatus for signal processing-based fault detection, isolation and remediation," the contents of which are hereby incorporated by reference in their entirety.

This application is also related to U.S. application Ser. No. 13/878,393, filed concurrently with the present application on Oct. 11, 2010, entitled: "Systems, methods, and apparatus for detecting and removing sensor signal impulse disturbances," the contents of which are hereby incorporated by reference in their entirety.

This application is also related to U.S. application Ser. No. 13/878,398, filed concurrently with the present application on Oct. 11, 2010, entitled: "Systems, methods, and apparatus for detecting irregular sensor signal noise," the contents of which are hereby incorporated by reference in their entirety.

This application is also related to application Ser. No. PCT/RU2010/000602, filed concurrently with the present application on Oct. 11, 2010, entitled: "Systems, methods, and apparatus for detecting agreement for individual channels among redundant sensor signals," the contents of which are hereby incorporated by reference in their entirety.

This application is also related to application Ser. No. PCT/RU2010/000596, filed concurrently with the present application on Oct. 11, 2010, entitled: "Systems, methods, and apparatus for remediating confidence values from redundant sensors," the contents of which are hereby incorporated by reference in their entirety.

This application is also related to application Ser. No. PCT/RU2010/000598, filed concurrently with the present application on Oct. 11, 2010, entitled: "Systems, methods, and apparatus for online estimation of standard deviation," the contents of which are hereby incorporated by reference in their entirety.

This application is also related to application Ser. No. PCT2010/000602, filed concurrently with the present application on Oct. 11, 2010, entitled: "Systems, methods, and apparatus for detecting agreement for individual channels among redundant sensor signals," the contents of which are hereby incorporated by reference in their entirety.

FIELD OF THE INVENTION

This invention generally relates to detecting shifts in sensor signals, and in particular, to detecting shifts in redundant sensor signals.

BACKGROUND OF THE INVENTION

Power plants utilize complex machinery and systems having components that often wear out over time and require replacement. One way to mitigate catastrophic or expensive failures is to establish regular maintenance and repair schedules for critical components that are known to wear out. Sensors and instrumentation are often overlooked in the maintenance process and they are often used until failure.

Closed-loop control systems rely on accurate feedback from instrumentation to properly regulate aspects of the system being controlled. Inaccurate or non-functional instrumentation can cause undesired effects in the system, potentially leading to hardware damage and a reduction in the lifetime of parts comprising the system. Furthermore, unnecessary downtime in normally functional equipment may result from faulty instrumentation signals that trigger a protective shutdown.

The standard approach to increasing robustness to instrumentation failures has been through sensor redundancy, whereby the number of redundant sensors is increased depending on whether the measured parameter is required for monitoring, control, or safety. Such redundant systems are generally able to continue functioning when a sensor fails, but they often require human intervention to investigate the sensor and/or the failure data to determine the failure mode. In some cases, the instrumentation failure must be corrected to restore accurate feedback and optimum operation of the machinery.

BRIEF SUMMARY OF THE INVENTION

Some or all of the above needs may be addressed by certain embodiments of the invention. Certain embodiments of the invention may include systems, methods, and apparatus for detecting shifts in redundant sensor signals. According to an example embodiment of the invention, a method is provided for detecting and indicating a shift in redundant sensor signals. The method can include receiving a sensor channel closeness signal for two or more redundant sensors; receiving a spike confidence signal for at least one of the two or more redundant sensors; receiving a spike duration signal for the at least one of the two or more redundant sensors; determining a shift confidence based at least in part on the received sensor channel closeness signal, the received spike confidence signal, and the received spike duration signal; and outputting the shift confidence.

According to an example embodiment of the invention, a system is provided for detecting and indicating a shift in redundant sensor signals. The system may include one or more sensors; at least one memory for storing data and computer-executable instructions; at least one processor configured to access the at least one memory and further configured to execute the computer-executable instructions for: receiving a sensor channel closeness signal for two or more redundant sensors; receiving a spike confidence signal for at least one of the two or more redundant sensors; receiving a spike duration signal for the at least one of the two or more redundant sensors; determining a shift confidence based at least in part on the received sensor channel closeness signal, the received spike confidence signal, and the received spike duration signal; and outputting the shift confidence.

According to another example embodiment, an apparatus is provided for detecting and indicating a shift in redundant sensor signals. The apparatus may include at least one memory for storing data and computer-executable instructions; at least one processor configured to access the at least one memory and further configured to execute the computer-executable instructions for: receiving a sensor channel closeness signal for two or more redundant sensors; receiving a spike confidence signal for at least one of the two or more redundant sensors receiving a spike duration signal for the at least one of the two or more redundant sensors; determining a shift confidence based at least in part on the received sensor channel closeness signal, the received spike confidence signal, and the received spike duration signal; and outputting the shift confidence.

Other embodiments and aspects of the invention are described in detail herein and are considered a part of the claimed invention. Other embodiments and aspects can be understood with reference to the following detailed description, accompanying drawings, and claims.

BRIEF DESCRIPTION OF THE FIGURES

Reference will now be made to the accompanying drawings and flow diagrams, which are not necessarily drawn to scale, and wherein.

DETAILED DESCRIPTION OF THE INVENTION

Figure 1:
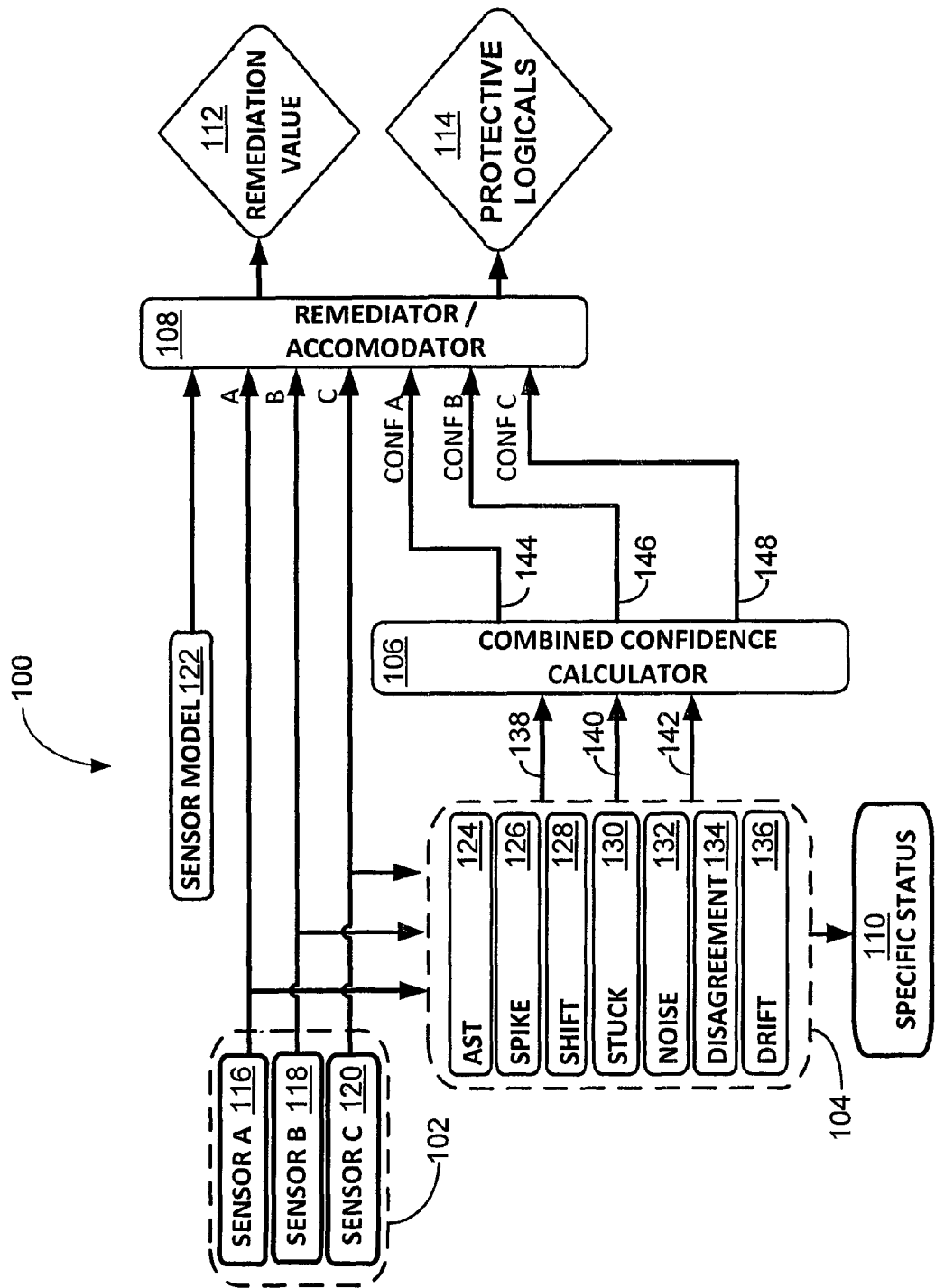
FIG. 1 is a block diagram of an illustrative fault detection, isolation, and remediation system, according to an example embodiment of the invention.

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Certain embodiments of the invention may enable the use of redundant sensors for monitoring, control, etc. According to certain example embodiments, signals from one or more sensors may be monitored and evaluated to detect certain faults or anomalies associated with the signals. In certain example embodiments, the sensor signals may be evaluated to determine a confidence associated with each signal. According to example embodiments, anomalous signals may be corrected (remediated), or isolated and ignored, depending on the confidence and/or availability of redundant signals. In certain example embodiments, signals from redundant sensors and/or information from a sensor model may be utilized in the evaluation and remediation.

According to example embodiments of the invention, signal-based statistical measurement diagnostics may be provided for analog simplex, duplex and triplex sensors. For example, the measurement diagnostics may include input signal processing for in-range fault detection, faulty channel isolation, and/or measured parameter remediation. Certain example embodiments of the invention may distinguish between fault-types, including: out-of-range (including loss of communication); spikes (or impulse disturbances); shift; channel insensitivity (stuck); abnormally high noise; redundant measurement disagreement; and slow drift. In certain example embodiments, fault detection may be based on specific fault-mode confidence calculations, which may be used to classify faults and may be combined to determine overall channel confidences. According to example embodiments, instantaneous channel confidences may be combined with historical information to derive a final confidence value for each sensor.

According to example embodiments, sensor selection may take into account system information to decide how to combine each of the sensor readings to produce a final output value for the measured parameter. In an example embodiment, long-term average confidence calculations for each sensor input may also provide diagnostic indications that can be used for preventative maintenance purposes.

According to an example embodiment of the invention a remediated value and/or a status may be changed when confidence values are below a pre-determined threshold for at least one of the one or more sensors or when monitored data from two or more of the one or more sensors differs by more than a predetermined amount. According to certain embodiments, one or more protective logicals may be provided as output based on the evaluations. In certain example embodiments, a remediated value may include direct or combined data from one or more sensors or a sensor model based at least in part on confidence values.

According to example embodiments of the invention, various system modules, processors, and input/output channels for achieving sensor signal fault detection, isolation and remediation will now be described with reference to the accompanying figures.

FIG. 1 illustrates an example fault detection, isolation, and remediation system block diagram 100 according to example embodiments of the invention. In an example embodiment, one or more redundant sensors 102 may be used for measuring parameters associated with one or more systems or apparatus. For example, the sensors 102 may be utilized for monitoring parameters (temperature, position, speed, pressure, concentration, etc.) associated with machinery or processes. In an example embodiment, signals from the one or more sensors 102, may be evaluated by detection and confidence determination blocks 104 and a combined confidence calculator block 106. In an example embodiment, detection and confidence determination blocks 104 and a combined confidence calculator block 106 may serve as an overall confidence estimation scheme, which may take into account channel health history and current confidences for each of the fault modes and sensors. For example, the fault modes or parameters which may be evaluated include availability status (AST) 124; spike 126, shift 128, stuck 130, noise 132, disagreement 134, and drift 136. The process for evaluating each of these modes will be explained further below.

In accordance with certain embodiments of the inventions, and with continued reference to FIG. 1, the signals from the sensors 102, data from a sensor model 122, and the output of the combined confidence calculator 106 may be input to a remediator/accommodator block 108. In an example embodiment, input to the remediator/accommodator block 108 may include signals from sensor A 116, sensor B 118, and sensor C 120 and may include corresponding confidence values for each sensor corresponding to each fault type or parameter (124-136). For example, confidences A 144, confidences B 146, and confidences C 148 may each include a vector or array of confidence values corresponding to parameters such as AST 124, spike 126, shift 128, stuck 130, noise 132, disagreement 134, and drift 136 for each sensor 116, 118, 120. Example embodiments may include identifying specific status 110 based at least in part on the one or more parameters 124-136.

According to certain example embodiments, the remediator/accommodatorremediation block 108 may produce a remediation value 112 that may be equivalent to a single "best, optimum, or modified" sensor signal. For example, the remediated value 112 may be a combination (mean or average) of sensor signals when two or more sensors are in close agreement and no other faults are detected. In other embodiments, the remediation value 112 may be derived in part from a sensor model 122, and/or from a cleaned-up version of one or more of the sensor signals. For example, outputting the remediated value 112 may include direct or combined data from one or more sensors 116, 118, 120 or a sensor model 122 based at least in part on the combined confidence values 144, 146, 148.

Example embodiments include outputting the remediated value 112 and status. In an example embodiment, the status may include one or more protective logicals 114. In an example embodiment, the protective logicals may indicate certain conditions, for example, when combined confidence values 144, 146, 148 are below a pre-determined threshold for at least one of the one or more sensors 116-120, or when monitored data from two or more of the one or more sensors 116-120 differs by more than a predetermined amount. According to example embodiments, outputting the remediated value 112 and status may include outputting direct or combined data from one or more sensors 116, 118, 120 or a sensor model 122 based at least in part on combined confidence values 144, 146, 148.

According to certain example embodiments of the invention, additional information may be produced and output based on the evaluations of the sensor 102 signals. For example, in certain example embodiments, protective logicals 114 may be output for protective actions and alarming. For example, protective actions may include unit trip, automatic shutdown, load reject, load step, sub-system disable water injection, slew to safe mode, etc. In certain example embodiments, the protective logicals 114 may include indication of the following conditions: (1) two sensors remaining; (2) one sensor remaining; (3) no sensors remaining, (4) differential fault with two sensors remaining, and/or (5) differential fault with three sensors remaining. In an example embodiment, the protective logicals 114 may produce conditions (1)-(3) above when the confidence of any of the parameters for the sensor channels are below the pre-determined threshold. In an example embodiment, protective logicals 114 may produce conditions (4) and (5) above when a fault is detected but unable to be isolated or attributed to a particular sensor or channel, and when the redundant channels differ by more than a pre-determined amount.

Figure 2:
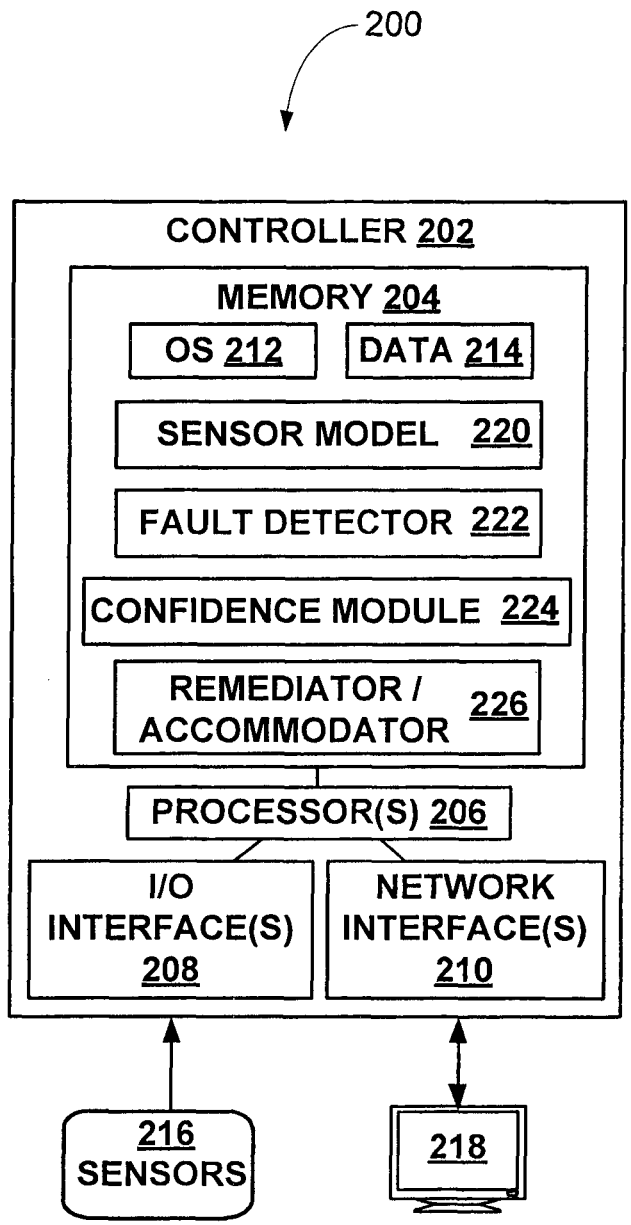
FIG. 2 is a block diagram of an illustrative processing system, according to an example embodiment of the invention.

FIG. 2 depicts a block diagram of a processing system 200, according to an example embodiment of the invention. In an example embodiment, the system 200 may include a controller 202. The controller 202 may include at least one memory 204 and at least one processor 206 in communication with the memory 204. The controller 202 may also include one or more input/output (I/O) interfaces 208 and/or one or more network interfaces 210 in communication with the processor(s) 206. In certain example embodiments of the invention, the memory 204 may include an operating system (OS) 212 and data 214. The memory 204 may also include modules that provide computer executable instructions for the processor 206. For example, the memory 204 may include a sensor model module 220 that may provide model information for comparison with the response from actual sensors. The memory 204 may also include fault detectors 222, confidence modules 224, and remediator/accommodator modules 226. According to an example embodiment of the invention, sensors 216 may be in communication with the processor 206 via the input/output interface(s) 208. In certain example embodiments, one or more human interface devices 218 may be in communication with the controller 202 via the network interface 210 or the input/output interface 208.

Figure 3:
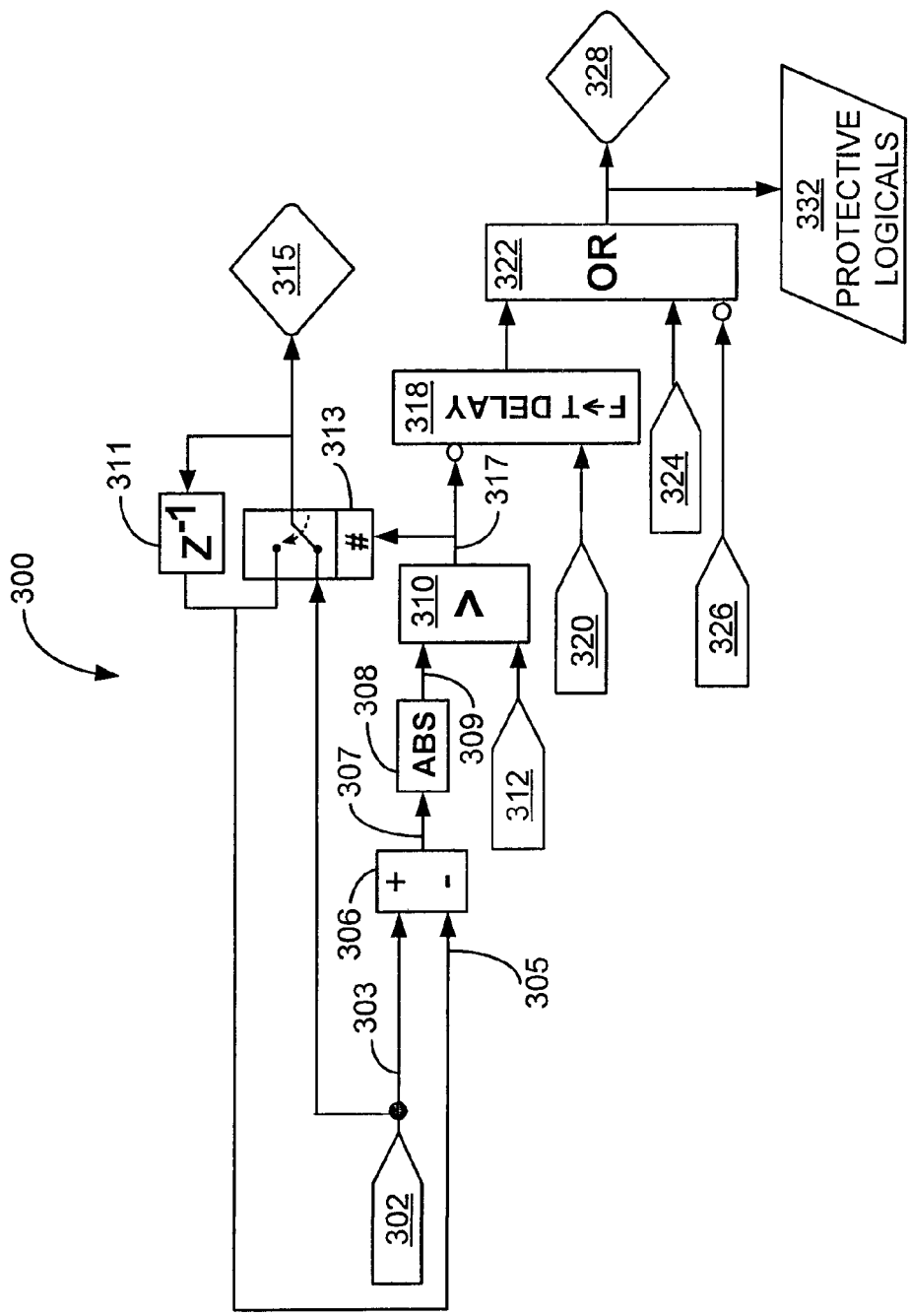
FIG. 3 is a block diagram of an illustrative spike detector, according to an example embodiment of the invention.

FIG. 3 depicts a block diagram of an illustrative spike detector, according to an example embodiment of the invention. In accordance with example embodiments of the invention, a "spike" may be defined as an impulse disturbance in a signal. For example, spikes in a signal may be caused by electromagnetic coupling, static, intermittent connections, etc. In a typical example embodiment, when a spike occurs in a signal, the level of the voltage and/or current associated with the signal will suddenly rise or fall, then return approximately to the value before the spike occurred. In one example embodiment, the duration of the spike may be extremely short, on the order of nanoseconds, and in some cases may be too short to measure or even detect, depending on the sampling frequency and method of sampling the signal. In other example embodiments, the spike or spikes may be on the order of microseconds, and may be detected and removed from an analog signal or digital sample stream, for example.

According to an example embodiment, a current value 303 (or sample or scan) of the input signal 302 may be compared to the value 305 (or sample or scan) of the signal prior to the spike(s). If the difference 307 in the values exceeds a predetermined threshold 312 and a spike indicator 317 goes true, a switch 313 may fix its output 315 to the previous scan 305 prior to the spike for a single sample, however, the switch 313 may be set to output the current sample 303 when no impulse disturbance is detected. In an example, the spike detector 300 may continue in this way until (a) a spike persists for the entire spike duration 320, in which case a shift is declared, or (b) the input is close to the value of the input prior to the spike.

With reference again to FIG. 3, and according to an example embodiment, the spike detector 300 may activate if the difference between the current sample 303 and a previous sample 305 is more than a predetermined threshold 312. In an example embodiment, an individual spike detector 300 may be used for each communication channel in a redundant sensor system. In an example embodiment, the spike detector 300 may be inhibited if the monitored channel value is far away from other available channels prior to the event. According to an example embodiment, the spike detector 300 may also activate a switch 313 and a single sample delay 311 to remove spikes and prevent spikes from being passed to the output 315. In certain example embodiments, a current standard deviation estimate (as will be described below with reference to FIG. 11) may be utilized to differentiate between spike and high noise faults.

Figure 4:
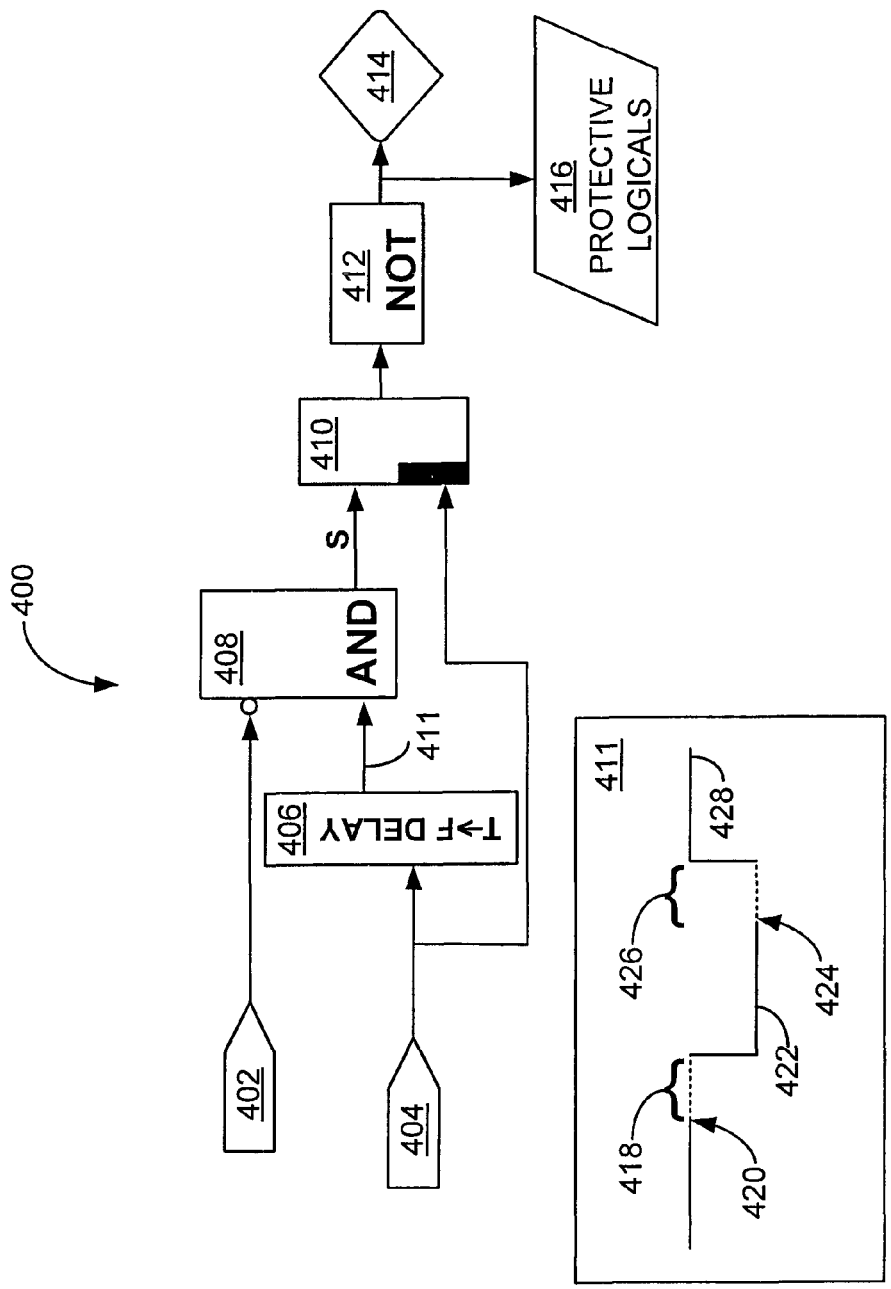
FIG. 4 is a block diagram of an illustrative shift detector, according to an example embodiment of the invention.

In an example embodiment, the spike detector 300 may receive several inputs for operation including: input samples 302 from a sensor; a threshold 312 for setting the activation of spike detection and/or removal; a pick-up time delay value 320 for setting the minimum time that the input samples must be spike free before restoring of spike confidence 328 or shift fault detection; an initialization input 324 for controlling when to ignore spikes; and a shift confidence 326 (which will be further discussed below with respect to FIG. 4).

In an example embodiment, the input sensor samples 302 may include a current sample 303. The current sample 303 may be compared with a previous sample 305 in a difference block 306 (for example, which may be a comparator or similar evaluation block). If the absolute value 309 of the difference 307 between the current sample 303 and the previous sample 305 is greater than the threshold 312, a spike indicator signal 317 may trigger a switch 313 to select and re-circulate the previous sample 305 for comparison 306 again with the next current sample 303. In an example embodiment, the single sample delay block 311 (in combination with the various comparisons 306, 310 and switch 313 described above) may provide an output signal 315 that is free of spikes.

Also shown in FIG. 3 is a part of the spike detector 300 that may provide protective logicals 332 and a spike confidence indication 328 based on certain inputs 320, 324, 326, and the spike indicator signal 317. In an example embodiment, the spike confidence indication 328 may be generated and output based at least in part on the signal samples 302. In an example embodiment, generating and outputting the spike confidence indication 328 may include delaying a restoring of the spike confidence indication 328 for a predetermined time 320 after an impulse disturbance has been cleared. In an example embodiment, when a spike is detected, the spike indicator signal 317 may go to a true state and may be inverted before entering the false-to-true delay block 318. If, for example, the next few input samples are spike free, the spike indicator signal 317 may go to a false state, and again be inverted at the false-to-true delay block 318. The output of the false-to-true delay block 318, however, may not be allowed to go to a true value until after a certain amount of time (or number of samples) has passed without a spike being detected. This amount of time may be called the pick-up time, and it may be set by the pick-up time delay input 320. As mentioned above, the pick-up time delay value 320 may be used for setting the minimum time that the input samples must be spike free before restoring the spike confidence indication 328. According to an example embodiment, the spike confidence indication 328 and protective logicals 332 outputs may also be controlled by the initialization input 324 or the shift confidence input 326 via the multi input OR block 322. In an example embodiment, if detected spikes persist for longer than the time delay 320, then a shift in signal may be reported rather than a spike. In certain embodiments, a true value in the spike confidence indication 328 may indicate that either: (a) a spike has not been detected for more than the period set by the delay time 320, (b) the spike detector 300 is ignoring spikes because it has not been initialized 324, or (c) a sensor signal shift 326 has been detected.

In certain example embodiments, one or more protective logical 332 outputs may be generated when an impulse disturbance (spike) is detected.

FIG. 4 depicts a shift detector 400 according to an example embodiment of the invention. In an example embodiment, the shift detector 400 may work in tandem with the spike detector 300 described above. According to example embodiments, the shift detector 400 may only be used for situations in which two or more (redundant) sensors are being utilized to monitor a particular phenomenon. According to an example embodiment, a shift may be detected when an unrealistic rate of change results in a large difference between redundant sensor signals.

Figure 7:
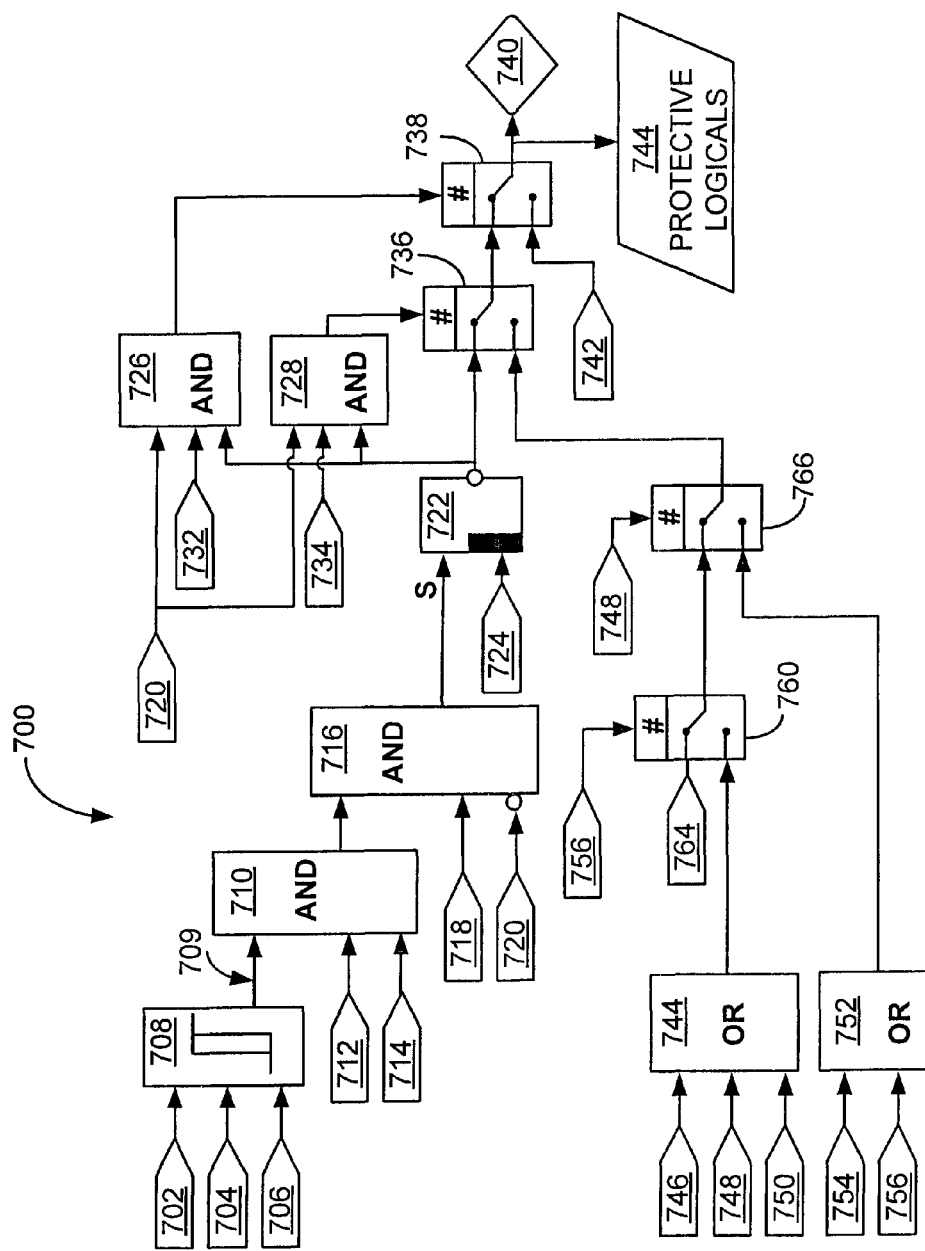
FIG. 7 is a block diagram of an illustrative agreement detector, according to an example embodiment of the invention.

In an example embodiment, the shift detector 400 may monitor a channel closeness signal 404 and a spike confidence signal 402. (The spike confidence signal 402 may be equivalent, for example, to 328 from FIG. 3). According to an example embodiment, the channel closeness signal 404 may be equivalent to the channel agreement confidence signal (for example, 740 as shown in FIG. 7 and described below). The channel closeness signal 404 may include a pick-up time delay 426, and then after passing through the true-to-false delay block 406, may then also include a dropout time delay 418, and may be designated as a channel closeness attribute signal 411. An example channel closeness attribute signal 411 with an example dropout time delay 418 and pick-up time delay 426 is depicted in the inset box of FIG. 4. For example, a channel closeness attribute signal 411 may initially be logic true, indicating channel agreement confidence, but at some point 420 in time, the redundant sensors may no longer agree. In an example embodiment, the dropout time delay 418 may be set to equal the spike duration and the channel closeness attribute signal 411 may remain true after disagreement 420 is detected for at least the duration of a spike, and then may change to a false state 422. In an example embodiment, the channel closeness attribute signal 411 may remain in a false state 422 until the channels agree again, at which point, the channel closeness attribute signal 411 may wait to go true again 428 until after a pick-up time delay 426. In an example embodiment, the pickup time delay 426 may equal the spike duration, or may be longer than the spike duration. In an example embodiment, the spike duration may be determined from the spike detector 300 (described above).

In an example embodiment, when the channel closeness attribute signal 411 is in a true state and the spike confidence signal 402 is in a false state, the set (S) input to the (reset dominated) latch 410 will be in a high state. The reset input to the latch 410 (indicated by the black rectangle) follows the channel closeness signal 404. In an example embodiment, in order to set the latch 410, the spike confidence signal 402 is false and the channel closeness signal 404 transitions from true to false. In an example embodiment, the reset condition for the latch 410 is that the channel closeness signal 404 is true for spikes longer than the spike duration. If this occurs, the reset-dominated latch 410 may be activated indicating a false shift confidence 414 which may indicate a shift fault in that channel via the inverter 412. In an example embodiment, the latch 410 may be reset if the channel with the fault becomes close to another non-faulted channel. In an example embodiment, the shift detector 400 may be inhibited for simplex redundancy due to the reset condition that requires multiple good channels.

According to example embodiments, the shift confidence 414 may be determined, at least in part, by determining a valid shift in a sensor signal when the received spike confidence signal 402 indicates no detected impulse disturbance; the received sensor channel closeness signal 404 initially indicates that channel differences for the two or more redundant sensors are within a predefined range; and the received sensor channel closeness signal 404 indicates whether the channel differences for the two or more redundant sensors are not within the predefined range after a period of time defined by the spike duration signal. According to an example embodiment, the predefined range may include a range of about 0.1% to about 10% of full scale.

According to an example embodiment, receiving the spike confidence signal 402 may be based at least in part on detecting a difference magnitude 307 between a current sample 303 and a previous sample 305 associated with the at least one of the two or more redundant sensors, where the difference magnitude 307 is greater than a predetermined threshold value 312.

In an example embodiment, outputting the shift confidence 414 includes logical multiplication 408 (or a logical AND operation) of an inverted spike confidence signal 402 and a channel closeness attribute 411. For example, the channel closeness attribute signal 411 may include a channel closeness signal 404 delayed 406 for a predetermined time defined by the spike duration signal, and an output of the logical multiplication 408 may set a latch 410. The latch 410, for example, may be reset when the channel closeness signal 404 is true, and an output of the latch 410 may be inverted and interpreted as a shift confidence 414. According to an example embodiment, the shift confidence 414 may be inhibited for non-redundant channels.

Figure 5:
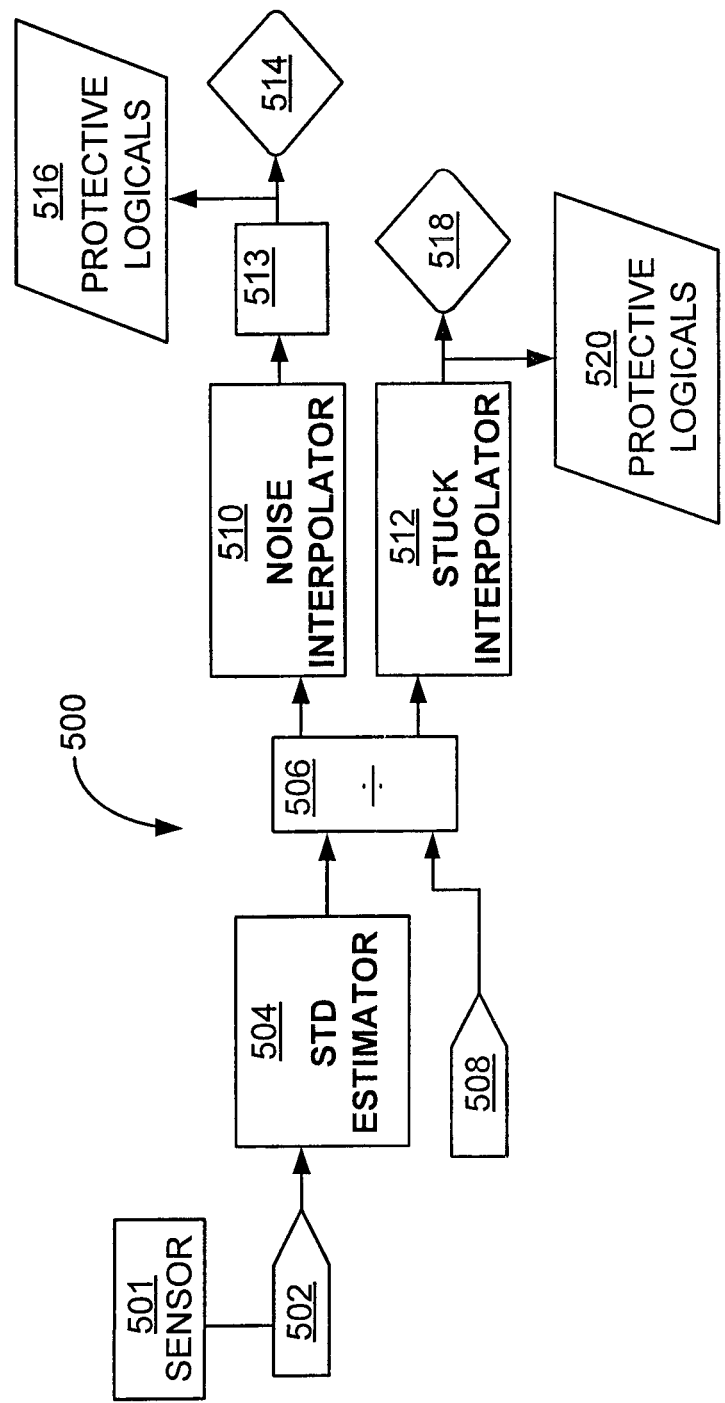
FIG. 5 is a block diagram of an illustrative noise/stuck detector, according to an example embodiment of the invention.

FIG. 5 depicts a noise/stuck detector 500 block diagram according to an example embodiment of the invention. In an example embodiment, high noise or low noise/stuck faults may be detected by comparing an estimated online noise standard deviation of a signal to an expected (predicted or normal) level of standard deviation. In an example embodiment, an interpolation table may be utilized to determine how far from expected the measured noise may be before declaring a fault.

In an example embodiment, and as shown in FIG. 5, a sensor 501 may provide a sensor signal sample 502 (free of spikes, for example, via the output 315 of FIG. 3), and this signal sample 502 may be input to a standard deviation estimator 504. The standard deviation estimator 504 may learn the normal amount of noise associated with an input signal, and estimate the noise standard deviation in real time. (Further details of the standard deviation estimation method in block 504 will be further explained below with reference to FIG. 11). In an example embodiment, the noise/stuck detector 500 may also receive an expected standard deviation value 508 that may be determined by training, for example from site or sensor specific locations where steady state samples may be used for training and producing the expected standard deviation value 508.

According to an example embodiment, a divide block 506 may take the output of the standard deviation estimator 504 and divide it by the expected standard deviation value 508. In an example embodiment, if the ratio of the estimated standard deviation 504 to the expected standard deviation value 508 is greater than about 20:1, then there may be something wrong with the signal, sensor, measurement, or upstream processing.

In an example embodiment, a first ratio computed by the divide block 506 may be output to a noise interpolator 510, and a second ratio computed by the divide block 506 may be output to stuck interpolator 512. In an example embodiment, the first and second ratios may be the same. In another example embodiment, the first and second ratios may be scaled differently. According to an example embodiment of the invention, the noise interpolator 510 may utilize an interpolation table to scale its output to an analog value between 1 and 0 to represent a noise confidence output 514. According to an example embodiment, the output of the noise interpolator 510 may be passed through a delay filter 513 having a first order lag to produce the noise confidence output 514. In certain example embodiments, protective logicals 516 may be generated based on the noise associated with the sensor values 502. In an example embodiment, a first ratio between about 2 and about 10 may be indicative of a sensor signal 502 that is operating in a normal range. In other embodiments, a first ratio greater than about 10 or about 20 may be indicative of a sensor signal 502 that is excessively noisy, and the noise confidence output 514 may reflect the amount of noise.

As mentioned above, and according to an example embodiment, the divide block 506 may provide a second ratio to the stuck interpolator 512. The stuck interpolator 512 may utilize an interpolation table to scale its output to an analog value between 1 and 0. The resulting stuck confidence value 518, for example, may indicate whether the sensor values 502 are changing (as normally expected), or if the sensor values 502 are abnormally steady. In example embodiments, a second ratio less than about 0.1 or 0.05 may be indicative of a sensor signal 502 that is stuck, and the stuck confidence value 518 may reflect such a condition. In an example embodiment, protective logicals 520 may be generated based on the value of the stuck confidence value 518. According to an example embodiment, the reliability of a sensor may be evaluated and determined using the noise/stuck detector 500.

Figure 6:
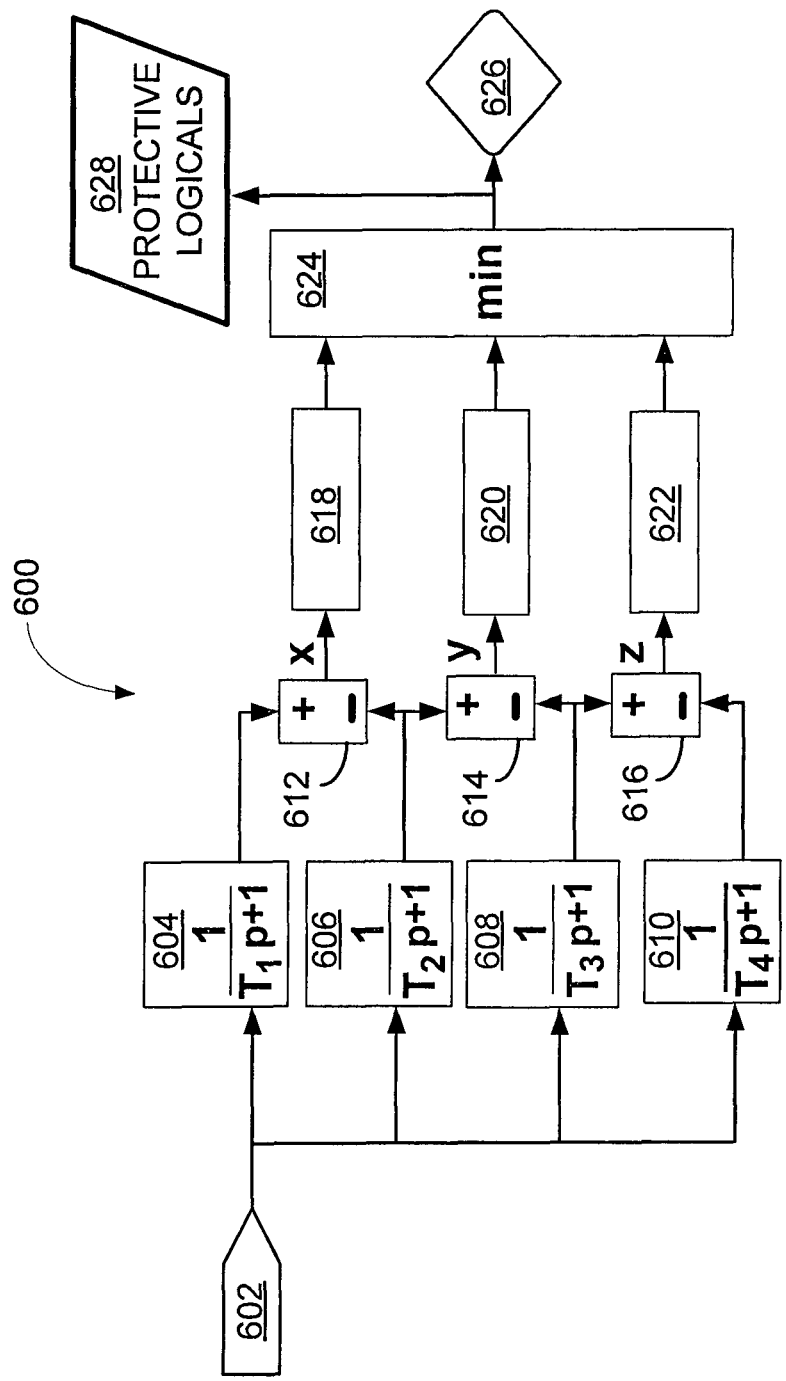
FIG. 6 is a block diagram of an illustrative drift detector, according to an example embodiment of the invention.

FIG. 6 shows a block diagram of a drift detector 600 according to an example embodiment of the invention. In an example embodiment, the drift detector 600 may monitor a sensor input 602 to detect slow changes while at steady state. In and example embodiment, the sensor input 602 may be sent to frequency separators in the form of lag filters 604, 606, 608, 610, each with different time parameters T1, T2, T3, T4 that may calculate smoothed derivatives according to the following example equation for the first two lag filters 604, 606:

$$\frac{(T_2 - T_1)s}{(T_2 s + 1)(T_1 s + 1)} = \frac{1}{T_2 s + 1} - \frac{1}{T_1 s + 1},$$

which may represent low pass filter frequency separators 604, 606, 608, 610, and the subtraction blocks 612, 614, 616. In an example embodiment, the first frequency separator lag filter 604 may have a time constant T1 of about 3; the second frequency separator lag filter 606 may have a time constant T2 of about 10; the third frequency separator lag filter 608 may have a time constant T3 of about 100; and the fourth frequency separator lag filter 610 may have a time constant T4 of about 1000. In accordance with certain example embodiments, modules x, y, and z output from subtraction blocks 612-616 may be normalized and adjusted for sensitivity. For example, the drift gate blocks 618, 620, 622 may calculate and output a value equal to the maximum of zero or 1−(abs X)/driftvalue, where X is the input and the driftvalue is a parameter that may be adjusted for sensitivity.

According to example embodiments, the output of the drift gate blocks 618, 620, 622 may be fed into a minimum evaluation block 624. In an example embodiment, if any of the values x, y, or z, become greater than the driftvalue, the drift confidence output 626 will be zero. According to example embodiments, protective logicals 628 may be output based on the drift confidence output 626.

FIG. 7 depicts a block diagram of an agreement detector 700, according to an example embodiment of the invention. In an example embodiment, the agreement detector 700 is utilized for two or more sensors, and it is bypassed if just one sensor is present.

According to example embodiments, the agreement detector 700 can compare a signal from sensor A with signals from sensor B and/or sensor C. Similar logic may be repeated for comparing signals from sensor B with sensor A and/or C, and again for signals from sensor C with sensor A and/or B.

According to other example embodiments, the agreement detector 700 may compare all valid channel pairs A-B, A-C, B-C of duplex or triplex sensors by using an agreement threshold 704. For example, a channel may produce an agreement fault in two situations: first, if three sensors are valid, and if one of the three channels differs from the other two by more than the agreement threshold 704; and second, when all available sensors are far away from each other. The second situation is known as "all channel disagreement" 720 and can occur with two or three valid channels. In an example embodiment, when a sensor model has been provided, all sensors that are not nearest to the model may have an agreement fault.

The example logic for processing sensor signals and determining agreement for one channel among the sensor signals will now be explained with reference to FIG. 7. In an example embodiment, an agreement process 708 may receive input from pair-wise available channels. For example, the agreement process 708 may receive the absolute value between sensor signals A and B (Abs (A-B)) 702, an agreement threshold 704, and anti-drizzling hysteresis 706. In an example embodiment, and as mentioned above, the Abs(A-B) 702 may involve two sensor channels, where A and B may represent pair-wise combinations of channels A, B, and C.

In an example embodiment, the agreement process 708 may produce a pair-wise agreement 709 based on the inputs 702, 704, 706. For example, determining the available sensor channel pair-wise agreement 709 may include comparing an absolute value of a difference 702 between two available sensor channels to a predetermined value 704. According to an example embodiment, the at least one sensor channel in pair-wise agreement may include at least one of two available sensor channels, where an absolute value of a difference 702 between the two available sensor channels is less than a predetermined value 704. In an example embodiment, determining the available sensor channel pair-wise agreement 709 may further include comparing an absolute value of a difference 702 between two available sensor channels to a predetermined hysteresis limit 706.

In an example embodiment, the pair-wise agreement 709, along with inputs representing the availability of sensors, for example, A available 712 and B available 714, may be input into a first AND Gate 710. In an example embodiment, the output of the first AND Gate 710 may be fed into a second AND Gate 716 along with the following inputs: "A disagrees with C" 718 and an inverted "all channel disagreement" 720.

According to an example embodiment of the invention, the logic input "A disagrees with C" 718 may be determined in a manner similar to the way the output of the AND Gate 710 is determined; however, the input "A disagrees with C" 718 may involve the comparison of channels A and C instead of A and B. For example, similar blocks corresponding to the hysteresis block 708 and the AND gate 710 may be used to generate "A disagrees with C" 718, but are not shown in FIG. 7.

In an example embodiment, the output of the second AND Gate 716 may be used to set a latch 722. The latch may be reset when A Close To B or C 724 is true. In an example embodiment, the output of the latch 722 may be inverted and may provide input to a first switch 736, a third AND Gate 726, and a forth AND Gate 728. The third AND Gate 726 may additionally receive inputs: "all channel disagreement" 720 and Model Invalid 732 to produce a signal output for switching a second switch 738. In an example embodiment, the fourth AND Gate 728 may additionally receive inputs: "all channel disagreement" 720 and Model Valid 734. In an example embodiment, the output of the fourth AND Gate 728 may provide a signal for switching a first switch 736. In an example embodiment, the first switch 736 and the second switch 738 may provide the path for outputting signals that indicate a single channel's agreement confidence 740 (for example: A, B, or C). In an example embodiment, protective logicals 744 may also be generated based on the state of the single channel's agreement confidence 740. According to example embodiments of the invention, the diagram of FIG. 7 may be repeated for each channel being examined.

In an example embodiment, when all of the inputs to the third AND Gate 726 are true, the second switch 738 may select a true state 742 for output to the single channel's agreement confidence 740. Otherwise, if any of the inputs to the third AND Gate 726 are false, the second switch 738 may select the output from the first switch 736. In an example embodiment, when all of the inputs to the fourth AND Gate 728 are true, the first switch 736 may select an output from a fourth switch 766. Otherwise, if there is a false input to the fourth AND Gate 728, the first switch 736 may select the inverted output from the latch 722.

In an example embodiment, the fourth switch 766 may select an input based on the availability of the other sensor(s). For example, B NOT Available 748 in a false state may select an output from a third switch 760. However, if B NOT Available 748 is in a true state, the fourth switch 766 may select the output from a first OR Gate 752. In an example embodiment, the first OR Gate 752 may produce a logical true if any or all of the following input conditions are met: $|A-M|<|C-M|$ 754 where M is the model (meaning that channel A is closer to the model than C is), C NOT available 756, or A and C are close 758.

In an example embodiment, determining the available sensor channel closest match 764 to the sensor model comprises determining a logical of specific A channel is closest to the sensor model 122 among all available sensor channels. In an example embodiment, the third switch 760 may select an input based on the availability of channel C. For example, C NOT available 756 in a false state may cause the third switch 760 to select the Minimum logical of A among $|A-M|$, $|B-M|$, $|C-M|$ 764 for output, where M is the model. However, in an example embodiment, when C NOT available 756 is in a true state, the third switch 760 may select the output of a second OR Gate 744 for output. In an example embodiment, the second OR Gate 744 may produce a logical true if any or all of the following input conditions are met: $|A-M|<|B-M|$ 746 where M is the model (meaning that channel A is closer to the model than B is), B NOT available 748, or A and B are close 750. According to example embodiments, the resulting individual channel agreement confidence 740 output of the logic described above can provide an indication of agreement for a single channel. In an example embodiment, the individual channel agreement confidence 740 output can indicate an agreement confidence when the available sensor channel most closely matches the valid sensor model. Conversely, in an example embodiment, an indication of no agreement confidence 740 may be output if one or no sensor is available. According to example embodiments, a similar process and logical diagram as shown in FIG. 7 could be used for determining agreement among channels B and C.

Figure 8:
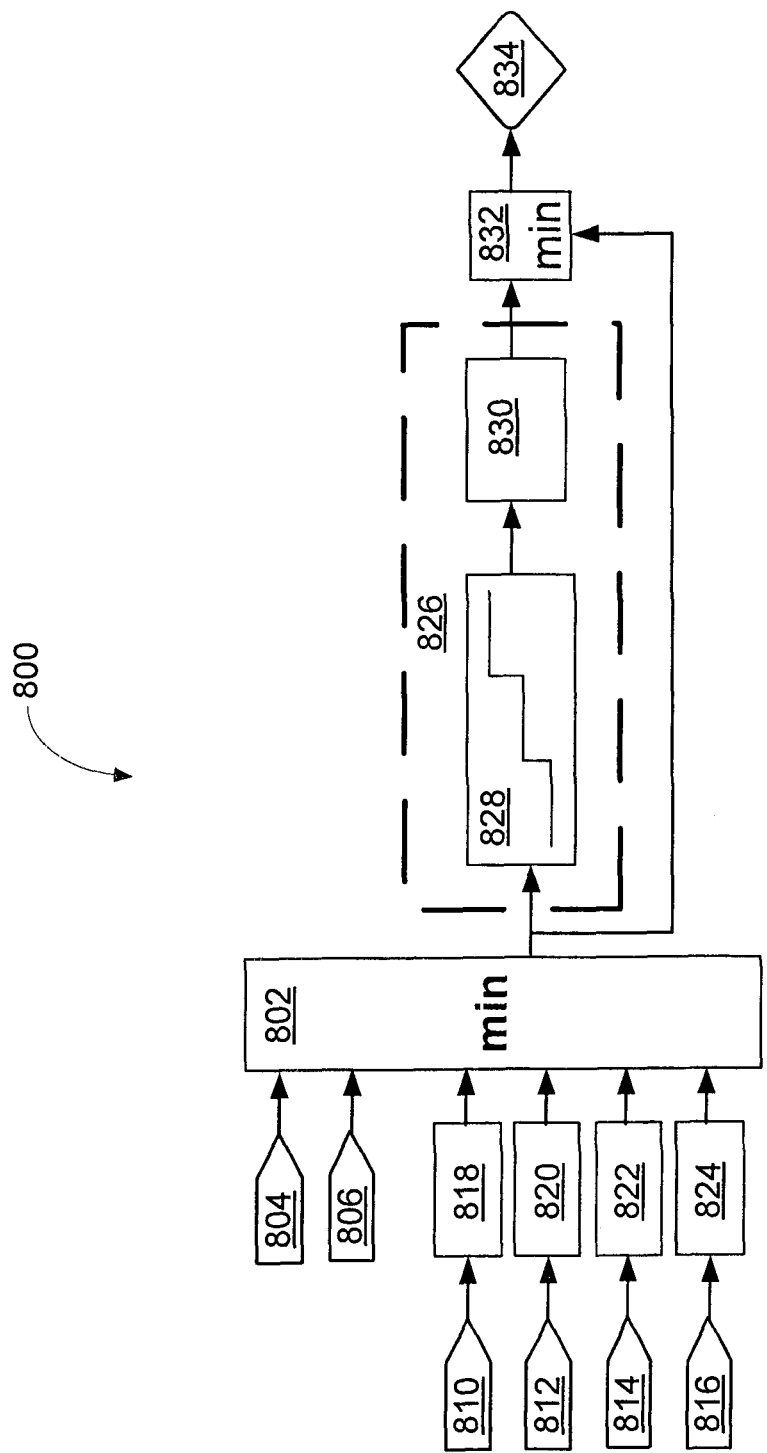
FIG. 8 is a block diagram of an illustrative combined confidence calculation, according to an example embodiment of the invention.

FIG. 8 depicts a block diagram of a combined confidence calculation 800, according to an example embodiment of the invention. (The combined confidence calculation 800 may correspond, for example, to block 106 of FIG. 1). In an example embodiment, all specific fault confidences may be combined by a first minimum select 802. For example, a noise confidence 804, a drift confidence 806, a spike confidence 810, a shift confidence 812, an agreement confidence 814 and an in-range confidence 816 may provide input to the first minimum select 802. In certain example embodiments, the fault confidences 810-816 may be converted to analog signals via converters 818-824 prior to being input to the first minimum select 802. In an example embodiment, the output of the first minimum select 802 may provide input to an optional history block 826 that may be de-selected immediately, but may require a recovery delay to be brought back on-line. In an example embodiment, the history block 826 may take the history of a particular sensor into account and may not allow the sensor to add to the confidence until it is operating correctly for a predetermined period. In an example embodiment, the combined confidence calculation 800 may be performed on a per-sensor basis.

According to an example embodiment, the history block 826 may include a non-linear transformer 828 that may separate the input confidence value into defining levels or ranges of confidence. In an example embodiment, the output of the non-linear transformer 828 may be passed to an integrator 830 that may provide smoothing, and may provide protection against intermittent failures. The output of the history block 826 may be an indication of channel health, and may be passed to a second minimum select 832. In an example embodiment, the second minimum select 832 may scale the output of the history bock 826 with the output of the first minimum select 802. In another example embodiment, the second minimum select 832 may select the minimum of the output from the first minimum select 802 or the output of the history block 826. In an example embodiment, the combined confidence calculation 800 may produce a combined confidence 834 for each redundant sensor. For example the combined confidence 834 may correspond to the combined confidences 144-148 from FIG. 1.

Figure 9:
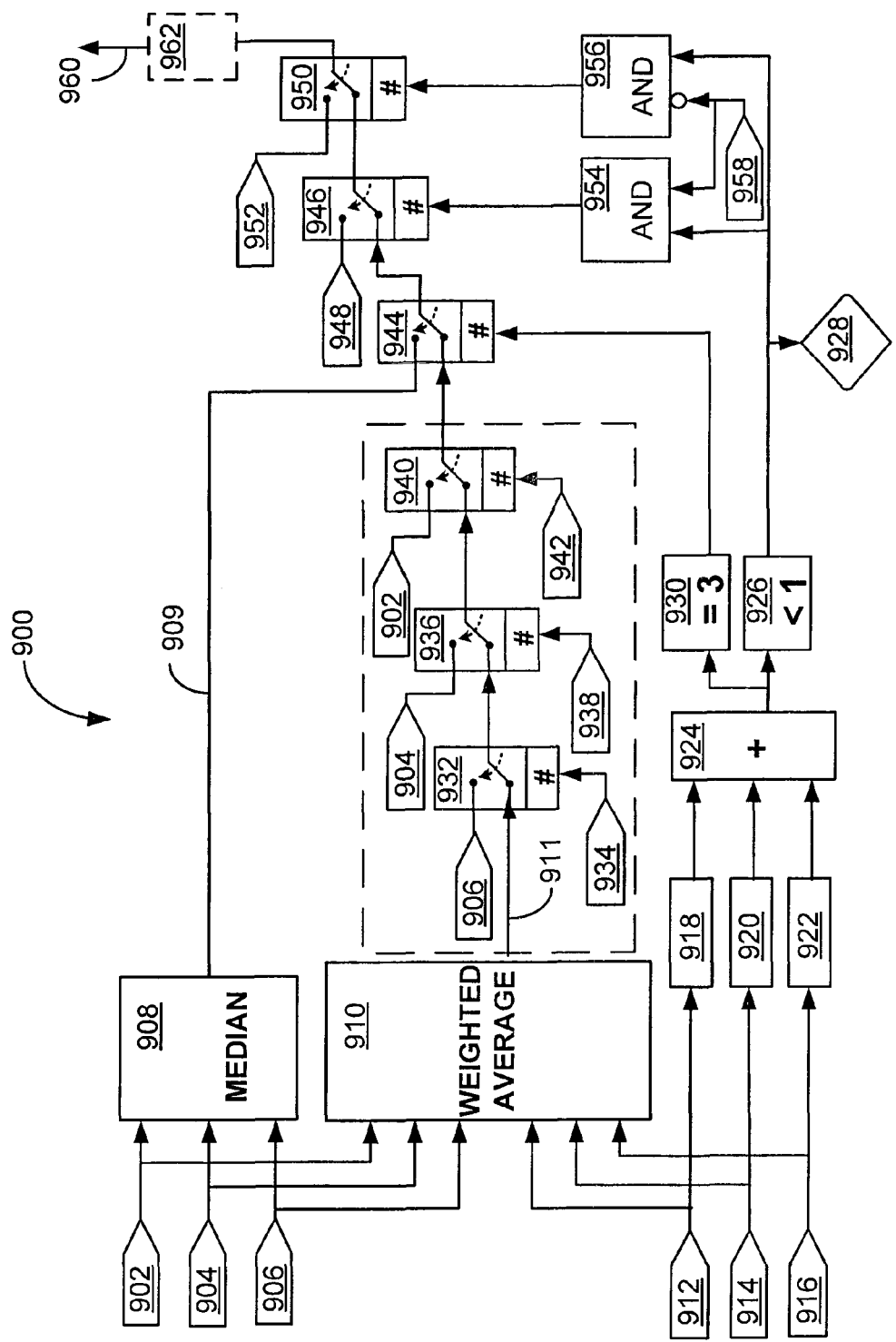
FIG. 9 is a block diagram of an illustrative remediation system, according to an example embodiment of the invention.

FIG. 9 depicts a block diagram of a remediation system 900 according to an example embodiment of the invention. (The remediation system 900 may correspond to the remediation block 108 in FIG. 1). In an example embodiment, the remediation system 900 may form the final remediated value 960 (corresponding to remediated value 112 of FIG. 1) and protective logicals 928 (corresponding to protective logicals 114 of FIG. 1). In an example embodiment, if three channels are available (for example, if the channel confidences are more than a predetermined value), a median selection 908 may take place. If two channels are available, a weighted average 910 of channel confidences may be used. If one channel is available, it is used. If all channels are failed, then a default value 952 is chosen. In an example embodiment, the default value 952 may be used until at least one channel becomes available.

In an example embodiment, outputting the remediated value 960 may further include outputting a modeled value 948 if a model is valid 958 or a default value 952 or when confidence values 912, 914, 916 for none of the one or more sensors 902, 904, 906 meet or exceed a respective pre-determined threshold 918, 920, 922. In an example embodiment, a protective logical may be output 928 when confidence values 912, 914, 916 for all of the one or more sensors 902, 904, 906 are below a pre-determined threshold 918, 920, 922.

According to an example embodiment, a protective logical from the agreement detector (as in 700 from FIG. 7) indicating a high differential between available signals may cause a minimum, a maximum, or a weighted average of the remaining sensors to be chosen as the remediated value 960. In an example embodiment, outputting the remediated value 960 may include pre-selecting and outputting a maximum, a minimum, or an average of received sensor signals from two of the one or more sensors 902, 904, 906 when confidence values 912, 914, 916 for two of the one or more sensors 902, 904, 906 exceed a pre-determined threshold 918, 920, 922 and differ more than a pre-determined differential value and no other fault is detected. In an example embodiment, this choice of pre-selecting and outputting a maximum, a minimum, or an average of received sensor signals may be made in advance based at least upon the safe direction for the sensor to fail. For example, a weighted average may be chosen if both directions are equally bad. In an example embodiment, a high differential may be indicated when the remaining "good" redundant sensors (2 or 3) differ by more than a specified threshold, and no other fault such as spikes, shift, etc., is detected.

In an example embodiment, sensors 902-906 and confidence values 912-916 may be monitored for redundant sensors. According to an example embodiment, receiving confidence values 912, 914, 916 may include receiving at least a minimum confidence selection of one or more parameters 124-136. The one or more parameters 124-136 may include one or more of availability status 124; spike 126; shift 128; stuck 130; noise 132; disagreement 134; or drift 136. In an example embodiment, the confidence values 912-916 may be monitored and converted to a true value or binary 1 by blocks 918-922 when the confidence is greater than a predetermined value. If the confidence is less than the predetermined value (indicative of low confidence), the blocks 918-922 may output a binary false or zero. In an example embodiment, a summation block 924 may add the converted confidence values from blocks 918-922. If the output of the summation block 924 is less than 1, the output of the <1 block 926 will be true, indicating a low confidence for all sensors. In an example embodiment, the <1 block 926 may trigger certain protective logicals 928. In an example embodiment, the output of the <1 block 926 may provide input to a first AND Gate 954 and a second AND Gate 956. In an example embodiment, an indication of a valid model 958 may also provide an input to the first AND Gate 954. In an example embodiment, if there is an indication of a valid model 958, and if there is low confidence for all sensors, the output of the first AND gate 954 may select, via a switch 946, a model value 948 for output to the remediated value 960. However, in an example embodiment where the model is not valid (as indicated by a false value on the valid model 958) and there is low confidence for all sensors, the second AND Gate 956 may invert the input from the valid model 958 and the output of the second AND Gate 956 may select a default value 952, via a switch 950, for output to the remediated value 960.

According to another example embodiment, when all of three redundant sensors are determined to be valid, or having high confidence, the output of the =3 block 930 may be true and a switch 944 may select a median value 909 of the sensor signals 902-906 for output to the remediated value 960.

In another example embodiment, when two of the sensors 902-906 are available, and when two of the sensor confidence values 912-916 are above a low confidence threshold, then a weighted average 910 of the sensor signals may be output to the remediated value 960. In certain examples, signals from individual sensors 902-906 may be available or pre-selected 934-942 for output to the remediated value 960.

According to an example embodiment, a snap smoother 962 may be provided before the output of the remediated value 960 to limit the rate of the remediated value change and to avoid fast jumps when the channel status is changed. In an example embodiment, a transition between an initial and the targeted value may be performed during the smoothing time. In an example embodiment, the smoother may be activated when the selection status does not correspond to the previous scan. For example, a confidence condition may cause selection of a median value 909 on one sample, then a weighted average 910 on the next sample, which may create a discontinuity in the remediated value 960 that can be smoothed by the snap smoother 962. In an example embodiment, after expiration of the smoothing time interval, the remediated value may equal the new value (weighted average in this example). In an example embodiment, the smoothing time may be increased when the default value mode takes part in the transition, either as the initial or target state.

Figure 10:
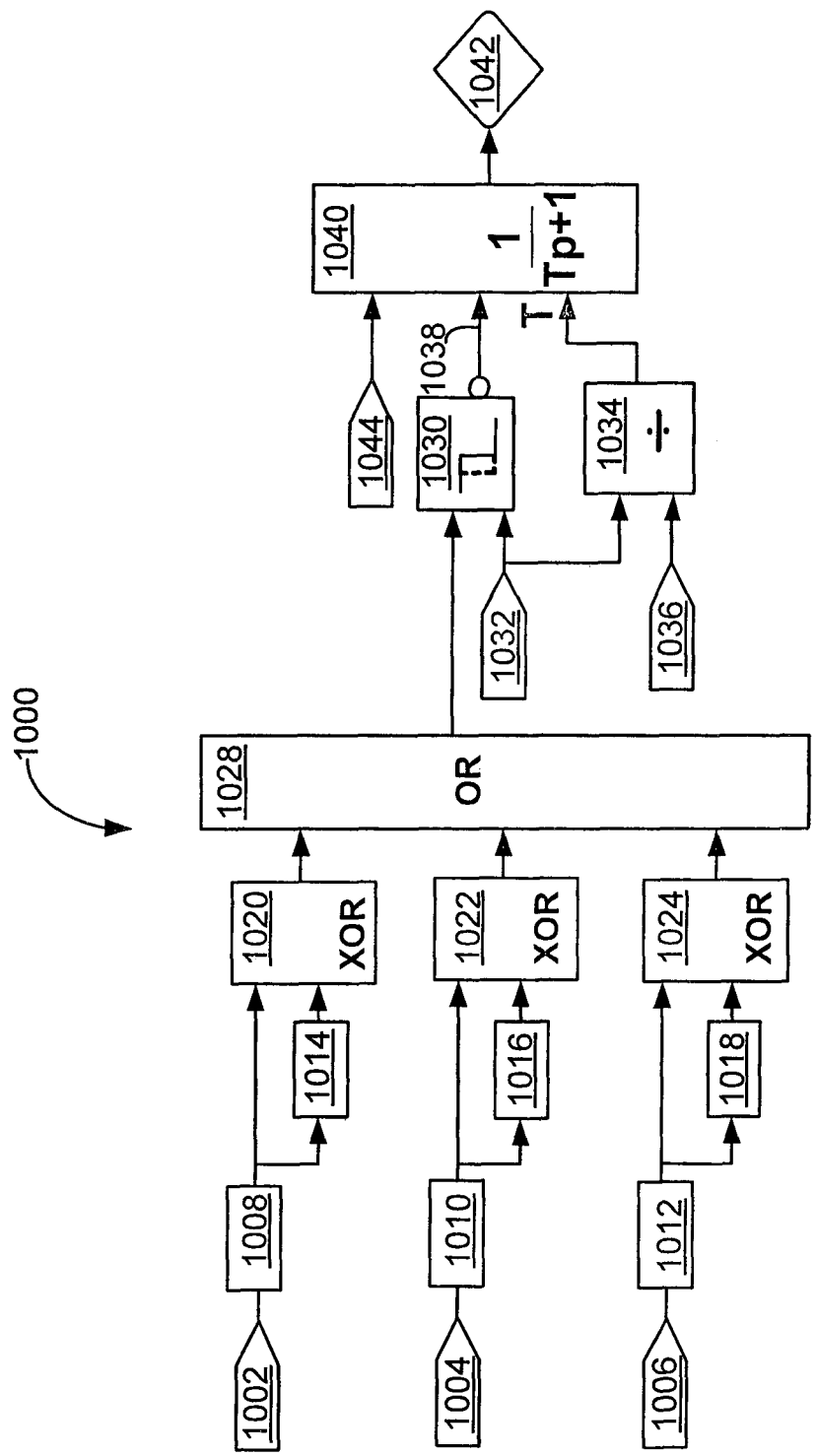
FIG. 10 is a block diagram of an illustrative snap smoother, according to an example embodiment of the invention.

FIG. 10 depicts a block diagram of an example snap smoother 1000. (The snap smoother 1000 may correspond to the snap smoother 962 of FIG. 9). In an example embodiment, the snap smoother 1000 may be applied to smooth the remediation value 1042 if the channel status and calculation rule is changed. For example, the detection of a state change may activate a lag filter 1040 that smoothes the output remediation value 1042 during a specified period. After the expiration of the smoothing time interval, the lag filter 1040 may be bypassed.

In certain example embodiments, the snap smoother 1000 may be implemented via a lag filter, rate limiter, or ramp functions. In an example embodiment, and as depicted in FIG. 10, global confidence values 1002-1006 for redundant sensors may be evaluated by <low confidence blocks 1008-1012 to determine if the confidence values are less than a predetermined confidence value. In an example embodiment, the binary output of the <low confidence blocks 1008-1012 may be split with one path input to exclusive OR gates 1020-1024, and another path input to delays 1014-1018 before being input to the other input of the exclusive OR gates 1020-1024. In an example embodiment, the output of the exclusive OR gates 1020-1024 may be input to an OR gate 1028. In an example embodiment, the output from the OR gate 1028 may provide an input for a programmable delay 1030. The programmable delay 1030, for example, may also receive a filtration period 1032 input. In an example embodiment, a change in confidence inputs 1002-1006 may activate the programmable delay 1030 to bypass the normal output 1044 (for example from switch 950 from FIG. 9) and instead provide a smoothed remediated output 1042 from a lag filter 1040. In an example embodiment, lag the filter 1040 may provide the smoothed remediated output 1042 based at least on a filtration coefficient 1036 and/or the filtration period 1032 while the programmable delay 1030 bypasses 1038 the normal output 1044.

Figure 11:
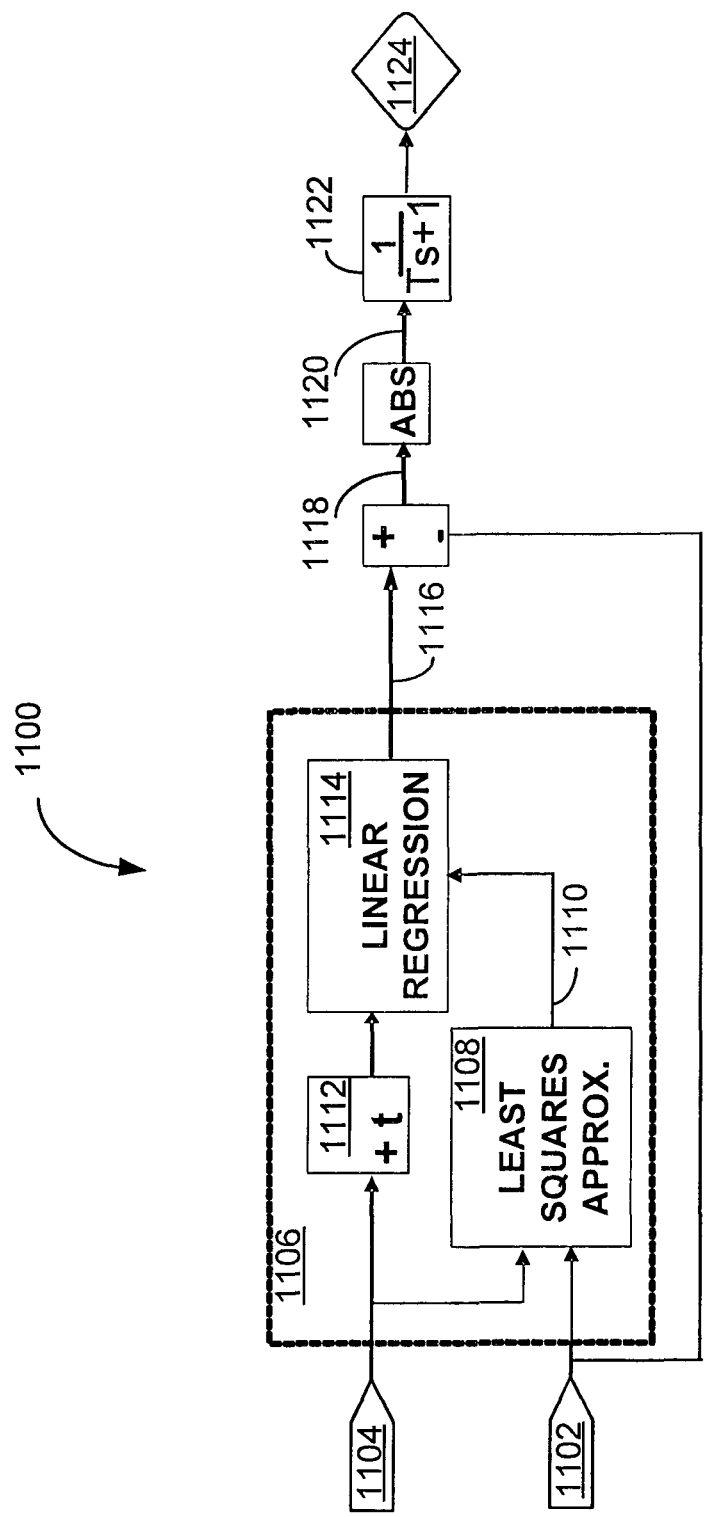
FIG. 11 is a block diagram of an illustrative standard deviation calculator, according to an example embodiment of the invention.

FIG. 11 depicts a block diagram of an online, standard deviation estimator 1100 for determining signal noise in sensor signal samples 1102. In an example embodiment, the estimate of the standard deviation 1124 may be derived based on the average deviation from the expected value of the signal, which may be forecast from a linear regression 1114. One advantage of this calculation method over traditional noise estimation methods is its low dependence on transient behavior.

In an example embodiment, an input signal measurement sequence x1, ..., xn 1102 with time stamps t1, ..., to 1104 may be interpreted as a stochastic function x(t). This function may be approximated by a linear regression curve of the form x=at+b, where the parameters a and b may be determined using a least-squares method according to the following equation:

$$\sum_{i=1}^{n} (x_i - (at_i + b))^2 \to \min_{a,b}$$ (Equation 1)

where x represents sensor signal samples 1102, t represents time, i represents indices 1104 associated with the input samples 1102, a and b represent regression coefficients 1110, and n represents the number of sensor signal samples 1102 utilized in determining the least squares approximation 1108. In an example embodiment, differentiating Equation 1 on unknown parameters a, b and optimizing for a minimum condition results in the following linear system:

$$a\sum_{i=1}^{n} t_i^2 + b\sum_{i=1}^{n} t_i = \sum_{i=1}^{n} x_i t_i$$ (Equation 2)

$$a\sum_{i=1}^{n} t_i + nb = \sum_{i=1}^{n} x_i,$$

where x represents sensor signal samples 1102, t represents time, i represents indices 1104 associated with the input samples 1102, a and b represent regression coefficients 1110, and n represents the number of sensor signal samples 1102 utilized in determining the linear regression 1114.

In an example embodiment, Kramer's method may be used to solve the system of Equation 1. Using computed solutions a, b, the expected value of the next data point may be calculated as xe=a(tn+t)+b, where t=sample time. The modulus of the current measurement deviation from the expected value (absolute value of x−xe) may be interpreted as the raw standard deviation estimate. In an example embodiment, the raw standard deviation estimate may then be smoothed by a lag filter.

According to certain example embodiments, the advantage of this approach compared to classical standard deviation estimation methods is significantly reduced time delay. The reduced time delay greatly reduces distortion of the standard deviation estimate during input signal transients. For example, dynamic measurements often contain fluctuations due to process transients as well as measurement noise. For the purposes of sensor health diagnostics, only measurement noise is desired in the standard deviation estimate. According to an example embodiment, measurement noise may be separated from the overall signal that contains additional process-related components. Traditional or classical methods of estimating the standard deviation of a signal (and therefore the noise content) often introduce significant biases to the estimation when the process variable itself is moving quickly.

Example embodiments of this invention are designed to address such deficiencies related with traditional methods of standard deviation estimation.

In an example embodiment, the standard deviation estimation method may provide noise estimation that is weakly dependent on transients and high-frequency process fluctuations. For example, one use of the standard deviation estimate is to detect abnormally high amounts of noise in a signal for the purposes of fault detection. In the context of sensors, this can be an early indication of in-range failure—such as a loose connection, for example. Detection of in-range failures may assist customers with preventative maintenance, prevent unnecessary trips due to instrumentation failures, and in extreme cases prevent catastrophic events such as hardware damage from occurring. Embodiments of the standard deviation estimator 1100 algorithm may allow high sensitivity to failures while maintaining robustness.

According to an example embodiment of the invention, and with continued reference to FIG. 11, the standard deviation estimator 1100 may include a regression extrapolator 1106 that may receive sensor signal samples 1102 and time indicia 1104. According to an example embodiment, the sensor signal samples 1102 and time indicia 1104 may be input to a least square's approximation block 1108 that may calculate regression coefficients a and b 1110 using Equation 1 above. In an example embodiment, determining regression coefficients 1110 is based at least in part on a least squares approximation 1108. The time indicia 1104 may also be input to a time advance block 1112. In an example embodiment, the output of the time advance block 1112 and regression coefficients a and b 1110 may be input to a linear regression block 1114 that may produce predicted sensor signal values 1116 according to Equation 2 above. In an example embodiment, determining the predicted value 1116 of the input samples 1102 is based at least in part on a linear regression 1114.

In an example embodiment, the sensor signal values 1102 may be subtracted from the predicted sensor signal values 1116 by a difference junction 1118, and the resulting difference may be processed by an absolute value block 1120. In an example embodiment, the output of the absolute value block 1120 may be filtered by a low pass filter 1122 to produce an estimate of the standard deviation 1124. In other words, in an example embodiment, a filtered estimate of the standard deviation 1124 may be determined by filtering 1122 the difference between the input samples 1102 and the predicted value 1116.

According to an example embodiment, the standard deviation estimator 1100 may determine the predicted value (1116) of the input samples (1102) based at least in part on advanced indices (1112).

Figure 12:
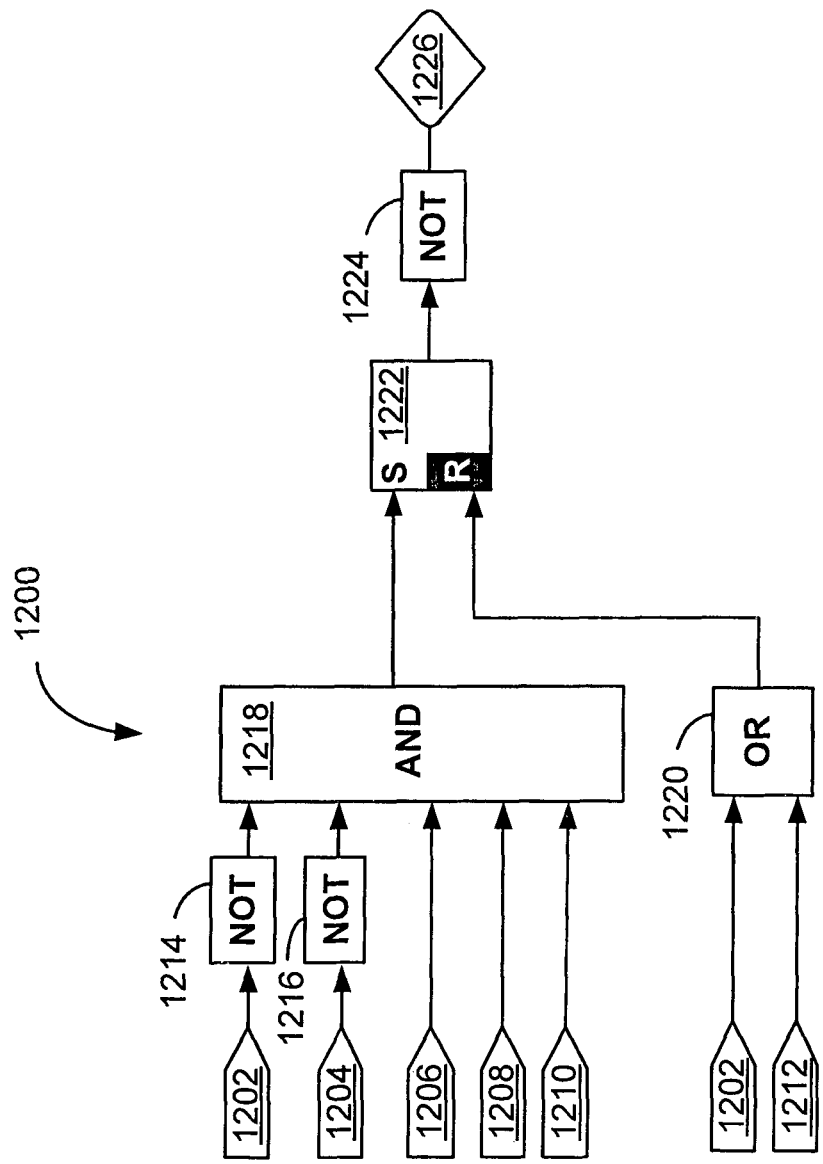
FIG. 12 is a block diagram of another illustrative agreement detector, according to an example embodiment of the invention.

FIG. 12 depicts a block diagram of another agreement detector 1200 embodiment. For simplicity, FIG. 12 depicts an embodiment for evaluating one of three redundant channel agreement combinations (A-B, B-C or A-C). According to an example embodiment, the agreement detector 1200 may receive several inputs representing conditions for determining agreement among the redundant sensor channels. In an example embodiment, a first condition 1212 may be an indication of pair-wise agreement with any other redundant sensor channels, regardless of status. A second condition 1202 may be an indication of whether one or less sensor channels are available. A third condition 1208 may be an indication of whether the total spread across all available sensor channels differs greater than an agreement threshold (as in 704 of FIG. 7). A fourth condition (not shown) may be an indication of whether an available outlier sensor channel or set of channels exists relative to a valid sensor model. A fifth condition 1210 may be an indication of whether the fourth condition is true, and the channel being examined is among the outlier channel(s).

According to an example embodiment, outputting an indication of agreement confidence (or no confidence) 1226 may include outputting an indication of zero agreement confidence when: a sensor model is valid 1206; the sensor channels are not 1216 in a state of initialization 1204; the second condition 1202 is not 1214 met; the third condition 1208 is met; and the fifth condition 1210 is met. In an example embodiment, an indication of a single channel agreement confidence 1226 may include outputting channel positive agreement confidence when the first condition 1212 is met or when the second condition 1202 is met. For example, if either input to the OR gate 1220 is true, the latch 1222 may be reset, and the false value output of the latch 1222 may be inverted 1224 to produce a true output 1226, indicating positive single channel agreement confidence.

According to an example embodiment, sensor channel pair-wise agreement 1212 (as in 709 of FIG. 7) may include an absolute value of a difference (as in 702 of FIG. 7) between two sensor channels less than an agreement threshold (as in 704 of FIG. 7). In an example embodiment, an available outlier sensor channel may include an available sensor channel having a maximum difference compared to a sensor model (as in 122 of FIG. 1). In an example embodiment, available sensor channels may include sensor channels having no parameter faults, where the parameters include availability (as in 124 of FIG. 1); spike (as in 126 of FIG. 1); shift (as in 128 of FIG. 1); stuck (as in 130 of FIG. 1); noise (as in 132 of FIG. 1); disagreement (as in 134 of FIG. 1); and drift (as in 136 of FIG. 1). According to an example embodiment, pair-wise disagreement between non-outlier sensor channels may include a difference greater than an agreement threshold (as in 704 of FIG. 7) between available sensor channels that are not outliers.

Figure 13:
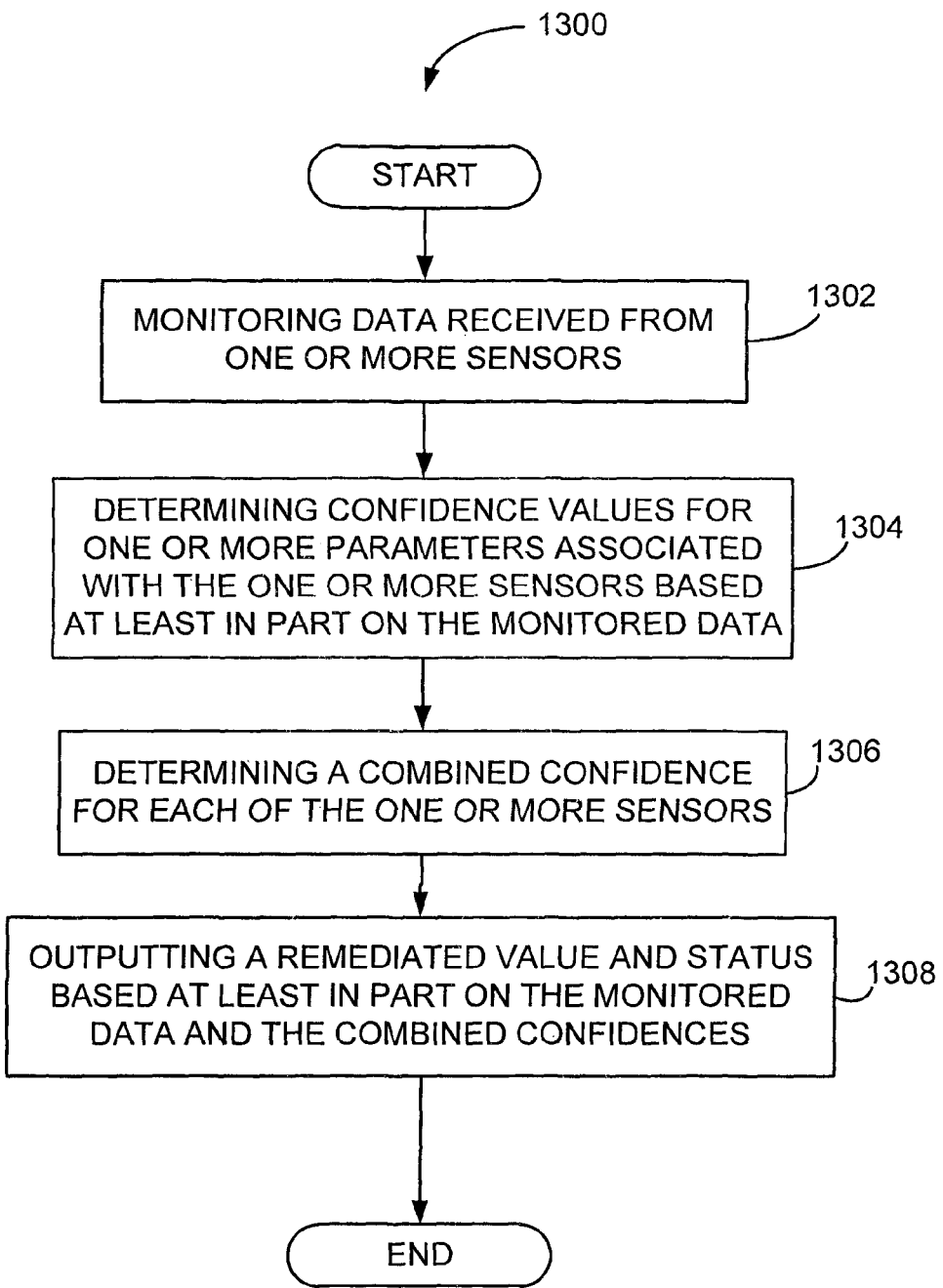
FIG. 13 is a flow diagram of a method, according to an example embodiment of the invention.

An example method 1300 for detecting and remediating sensor signal faults will now be described with reference to the flow diagram of FIG. 13. The method 1300 starts in block 1302 and according to an example embodiment of the invention, the method 1300 includes monitoring data received from one or more sensors. In block 1304, the method 1300 includes determining confidence values for one or more parameters associated with the one or more sensors based at least in part on the monitored data. In block 1306, the method 1300 includes determining a combined confidence for each of the one or more sensor. In block 1308, the method 1300 includes outputting a remediated value and status based at least in part on the monitored data and the combined confidences. The method 1300 ends after block 1308.

Figure 14:
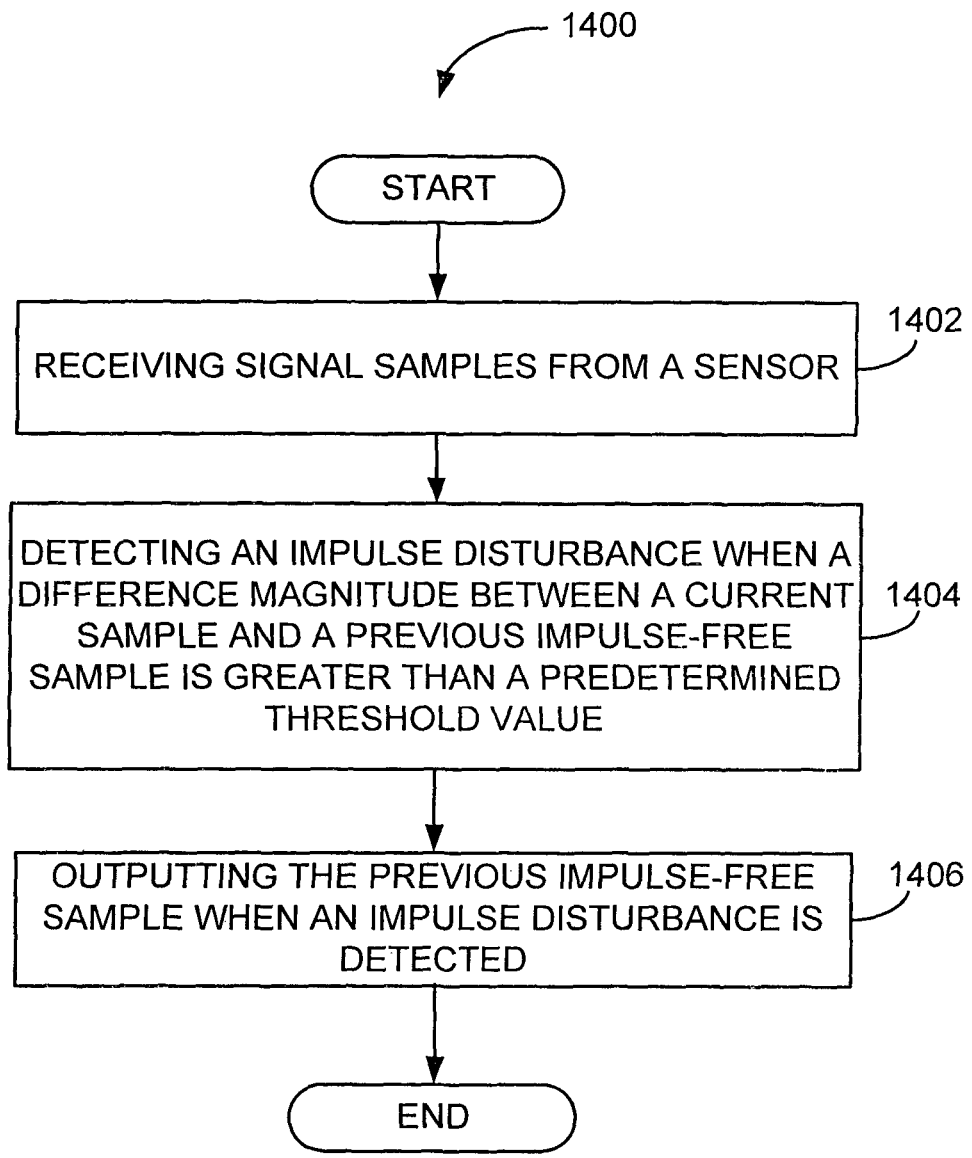
FIG. 14 is a flow diagram of a method, according to an example embodiment of the invention.

An example method 1400 for detecting and removing impulse disturbances associated with a sensor signal will now be described with reference to the flow diagram of FIG. 14. The method 1400 starts in block 1402 and according to an example embodiment of the invention, the method 1400 includes receiving signal samples from a sensor. In block 1404, the method 1400 includes detecting an impulse disturbance when a difference magnitude between a current sample and a previous impulse-free sample is greater than a predetermined threshold value. In block 1406, the method 1400 includes outputting the previous impulse-free sample when an impulse disturbance is detected. The method 1400 ends after block 1406.

Figure 15:
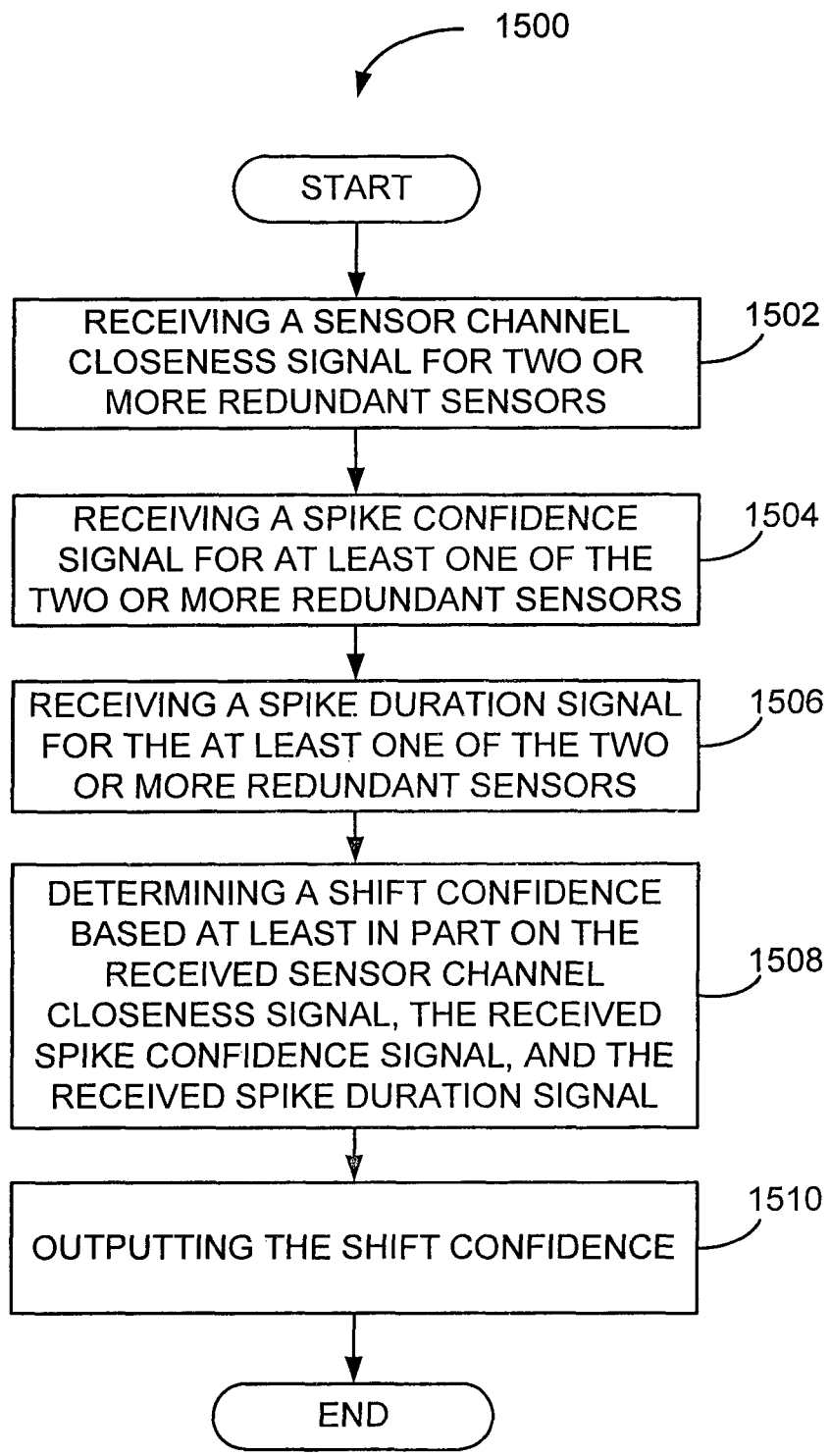
FIG. 15 is a flow diagram of a method, according to an example embodiment of the invention.

An example method 1500 for detecting and indicating a shift in redundant sensor signals will now be described with reference to the flow diagram of FIG. 15. The method 1500 starts in block 1502 and according to an example embodiment of the invention, the method 1500 includes receiving a sensor channel closeness signal for two or more redundant sensors. In block 1504 and according to an example embodiment of the invention, the method 1500 includes receiving a spike confidence signal for at least one of the two or more redundant sensors. In block 1506 and according to an example embodiment of the invention, the method 1500 includes receiving a spike duration signal for the at least one of the two or more redundant sensors. In block 1508 and according to an example embodiment of the invention, the method 1500 includes determining a shift confidence based at least in part on the received sensor channel closeness signal, the received spike confidence signal, and the received spike duration signal. In block 1510 and according to an example embodiment of the invention, the method 1500 includes outputting the shift confidence. The method 1500 ends after block 1510.

Figure 16:
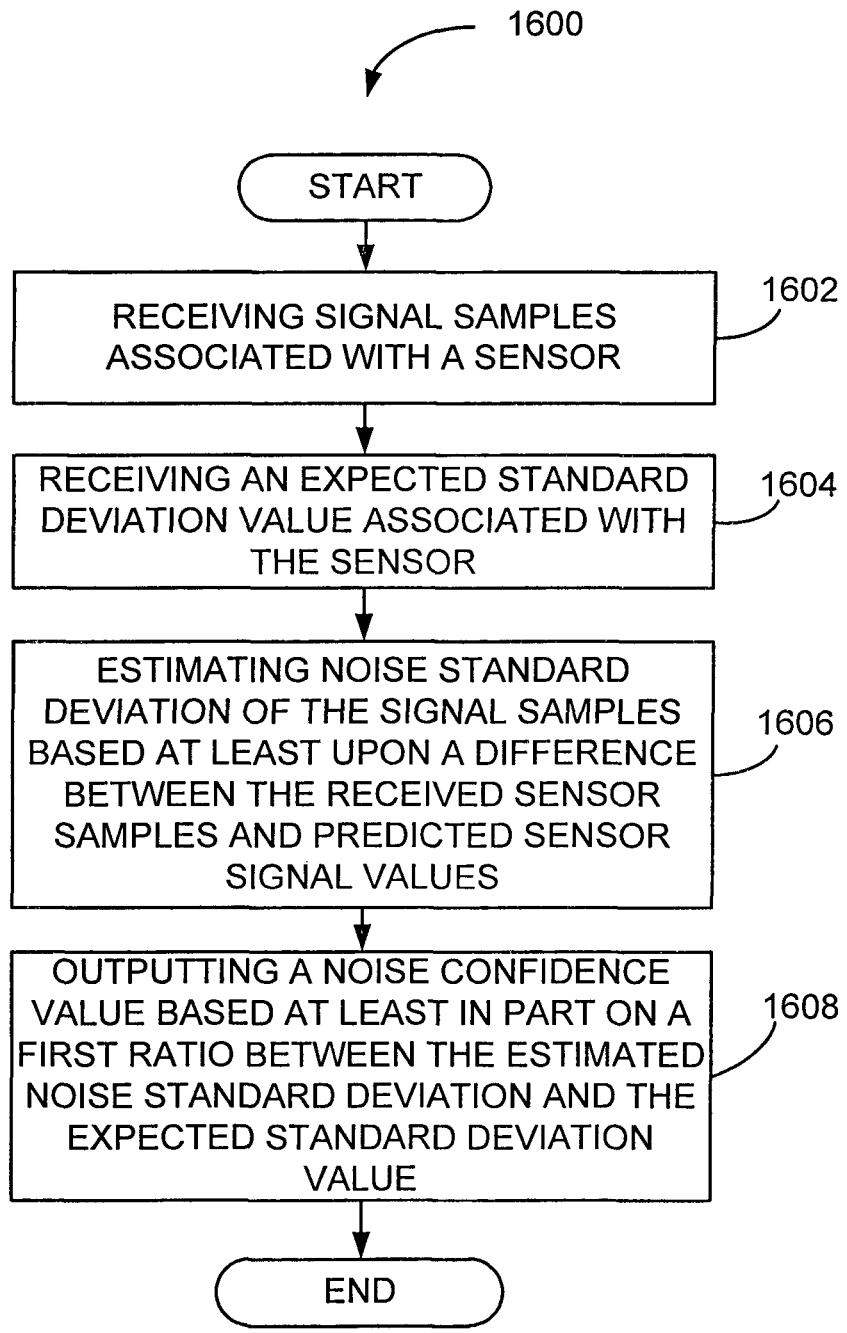
FIG. 16 is a flow diagram of a method, according to an example embodiment of the invention.

An example method 1600 for determining reliability of a sensor will now be described with reference to the flow diagram of FIG. 16. The method 1600 starts in block 1602 and according to an example embodiment of the invention, the method 1600 includes receiving signal samples associated with a sensor. In block 1604 and according to an example embodiment of the invention, the method 1600 includes receiving an expected standard deviation value (e.g., 508) associated with the sensor. In block 1606 and according to an example embodiment of the invention, the method 1600 includes estimating noise standard deviation of the signal samples based at least upon a difference between the received sensor samples and predicted sensor signal values. In block 1608 and according to an example embodiment of the invention, the method 1600 includes outputting a noise confidence value based at least in part on a first ratio between the estimated noise standard deviation and the expected standard deviation value. The method 1600 ends after block 1608.

Figure 17:
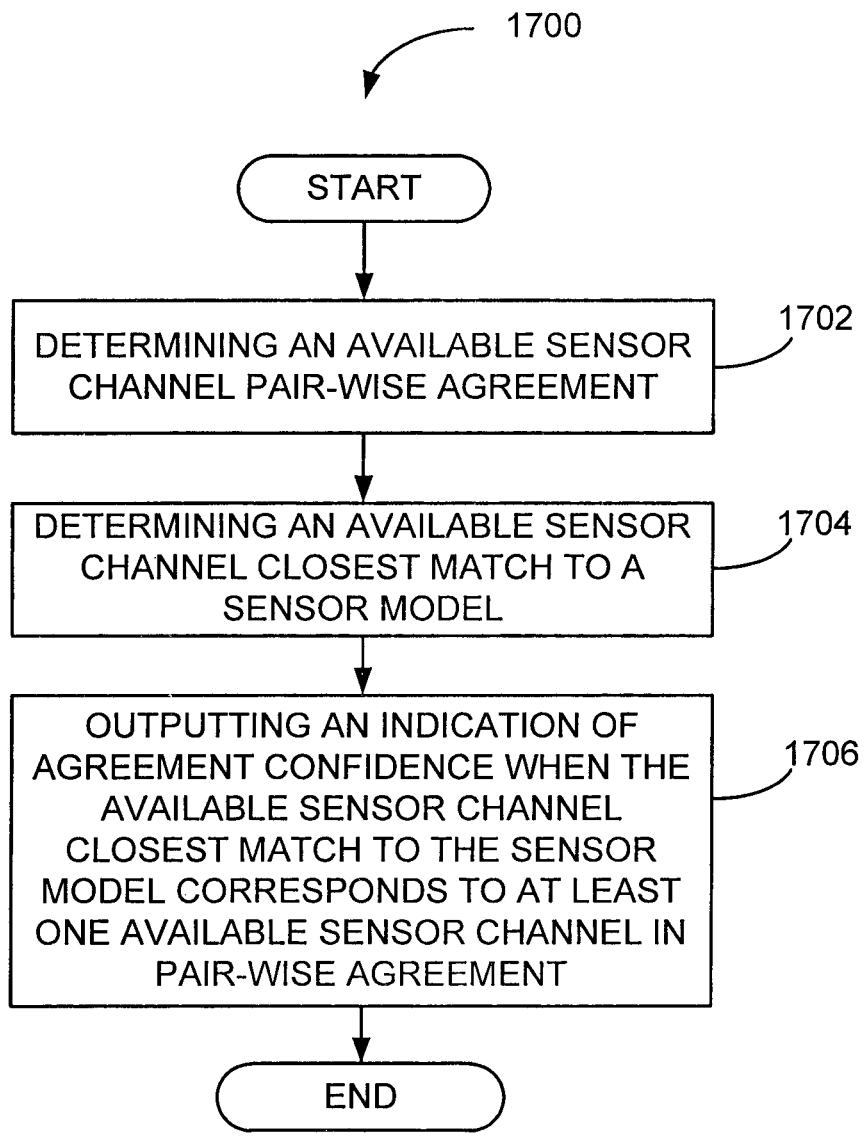
FIG. 17 is a flow diagram of a method, according to an example embodiment of the invention.

An example method 1700 for detecting and indicating agreement confidence for redundant sensor channels and a sensor model will now be described with reference to the flow diagram of FIG. 17. The method 1700 starts in block 1702 and according to an example embodiment of the invention, the method 1700 includes determining an available sensor channel pair-wise agreement. In block 1704 and according to an example embodiment of the invention, the method 1700 includes determining an available sensor channel closest match to a sensor model. In block 1706 and according to an example embodiment of the invention, the method 1700 includes outputting an indication of agreement confidence when the available sensor channel closest match to the sensor model corresponds to at least one available sensor channel in pair-wise agreement. The method 1700 ends after block 1706.

Figure 18:
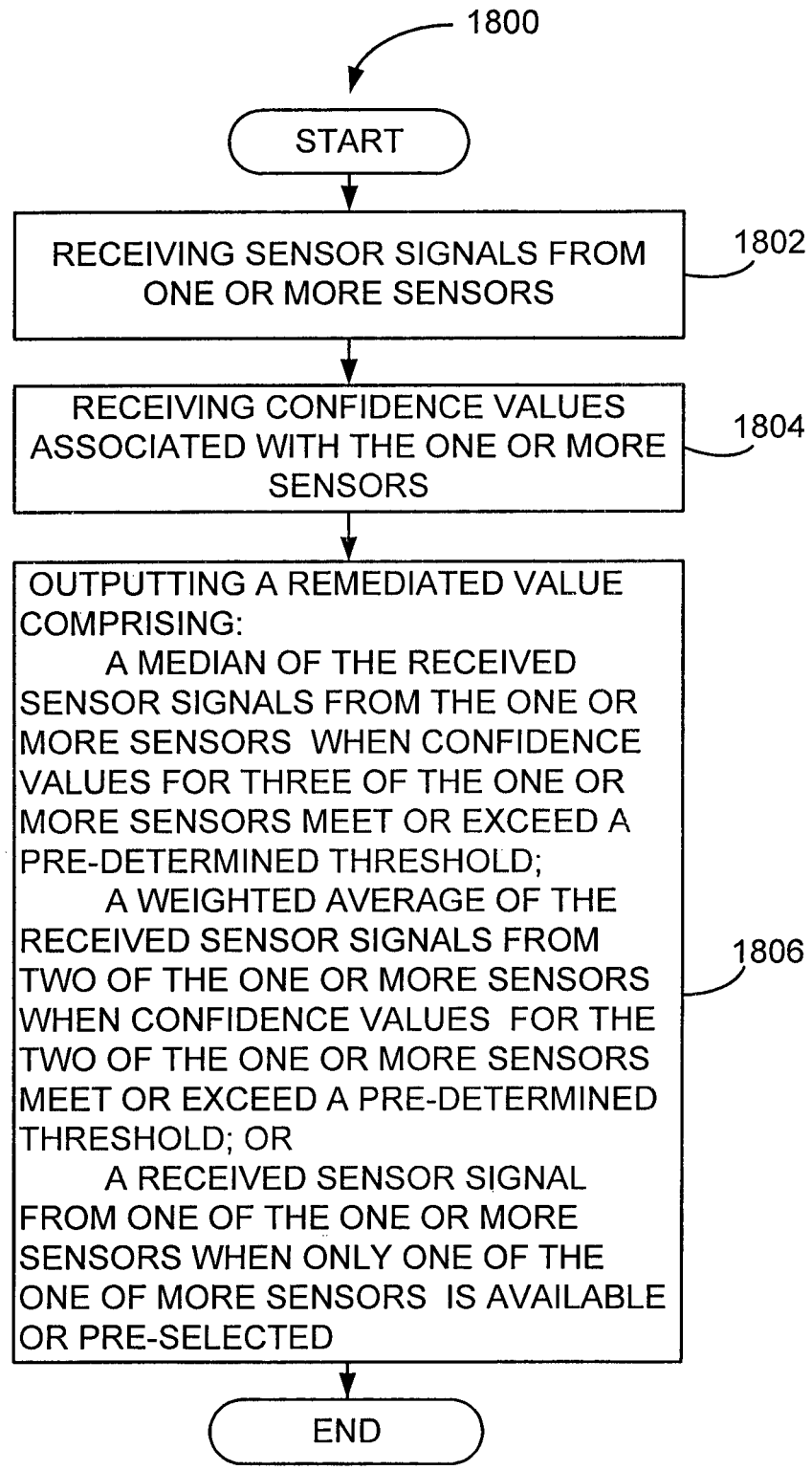
FIG. 18 is a flow diagram of a method, according to an example embodiment of the invention.

An example method 1800 for remediating information from redundant sensors will now be described with reference to the flow diagram of FIG. 18. The method 1800 starts in block 1802 and according to an example embodiment of the invention, the method 1800 includes receiving sensor signals from one or more sensors. In block 1804 and according to an example embodiment of the invention, the method 1800 includes receiving confidence values associated with the one or more sensors. In block 1806 and according to an example embodiment of the invention, the method 1800 includes outputting a remediated value. The remediated value may include: a median of the received sensor signals from the one or more sensors when confidence values for three of the one or more sensors meet or exceed a pre-determined threshold; a weighted average of the received sensor signals from two of the one or more sensors when confidence values for the two of the one or more sensors meet or exceed a pre-determined threshold; or a received sensor signal from one of the one or more sensors when only one of the one or more sensors is available or pre-selected. The method 1800 ends after block 1806.

Figure 19:
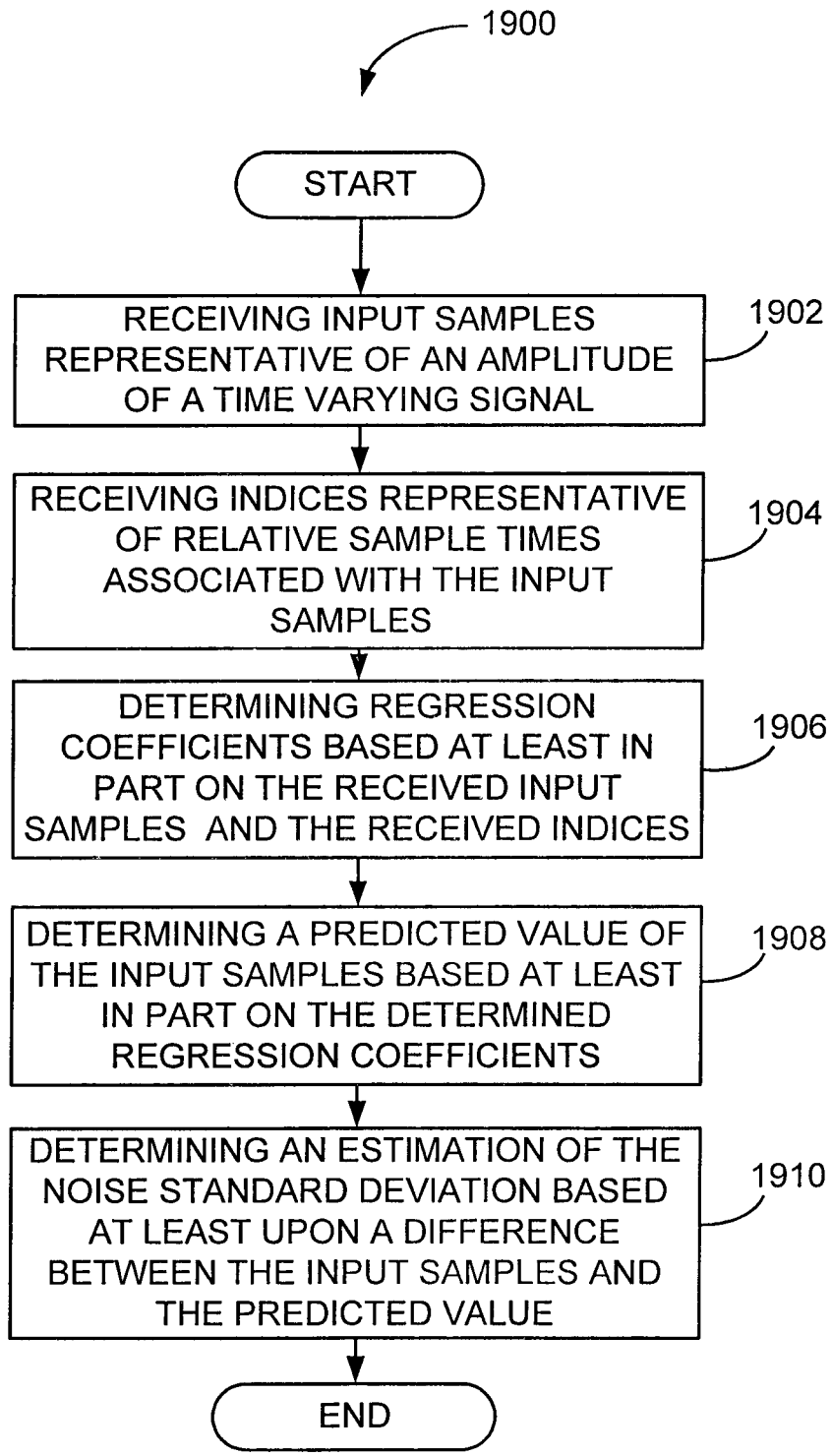
FIG. 19 is a flow diagram of a method, according to an example embodiment of the invention.

An example method 1900 for estimating a noise standard deviation in a time varying signal will now be described with reference to the flow diagram of FIG. 19. The method 1900 starts in block 1902 and according to an example embodiment of the invention, the method 1900 includes receiving input samples representative of an amplitude of a time varying signal. In block 1904 and according to an example embodiment of the invention, the method 1900 includes receiving indices representative of relative sample times associated with the input sample. In block 1906 and according to an example embodiment of the invention, the method 1900 includes determining regression coefficients based at least in part on the received input samples and the received indices. In block 1908 and according to an example embodiment of the invention, the method 1900 includes determining a predicted value of the input samples based at least in part on the determined regression coefficients. In block 1910 and according to an example embodiment of the invention, the method 1900 includes determining an estimation of the noise standard deviation based at least upon a difference between the input samples and the predicted value. Method 1900 ends after block 1910.

Figure 20:
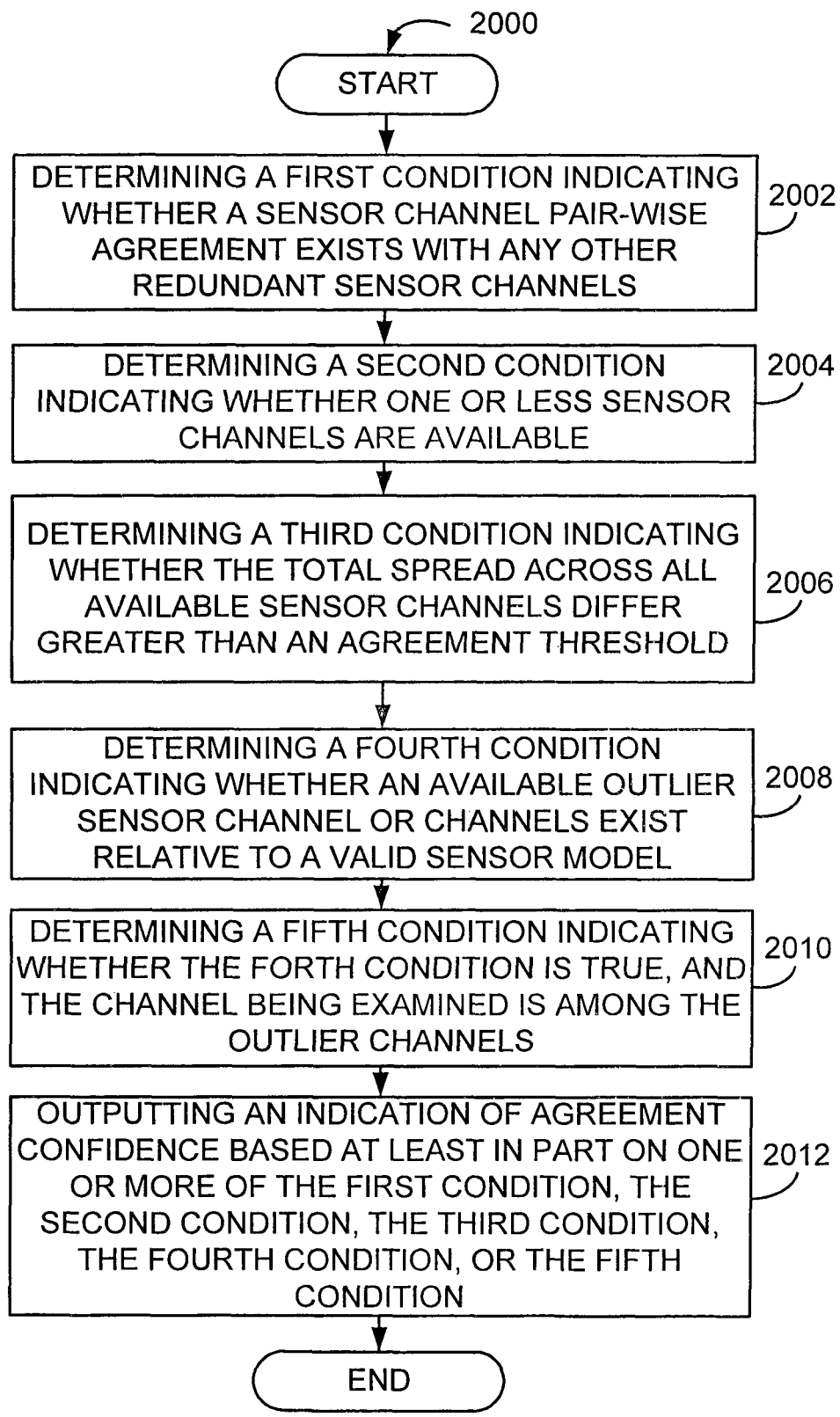
FIG. 20 is a flow diagram of a method, according to an example embodiment of the invention.

An example method 2000 for detecting and indicating agreement confidence 1226 for redundant sensor channels and a sensor model will now be described with reference to the flow diagram of FIG. 20. The method 2000 starts in block 2002 and according to an example embodiment of the invention, the method 2000 includes determining a first condition 1212 indicating whether a sensor channel is in pair-wise agreement 709 with any other redundant sensor channels (regardless of status). In block 2004 and according to an example embodiment of the invention, the method 2000 includes determining a second condition 1202 indicating whether one or less sensor channels are available. In block 2006 and according to an example embodiment of the invention, the method 2000 includes determining a third condition 1208 indicating whether the total spread across all available sensor channels differ greater than an agreement threshold 704. In block 2008 and according to an example embodiment of the invention, the method 2000 includes determining a fourth condition indicating whether an available outlier sensor channel or channels exist relative to a valid sensor model. In block 2010 and according to an example embodiment of the invention, the method 2000 includes determining a fifth condition 1210 indicating whether the fourth condition is true, and the channel being examined is among the outlier channels. In block 2012 and according to an example embodiment of the invention, the method 2000 includes outputting an indication of agreement confidence 1226 based at least in part on one or more of the first condition, the second condition, the third condition, the fourth condition, or the fifth condition. The method 2000 ends after block 2012.

Accordingly, example embodiments of the invention can provide the technical effects of creating certain systems, methods, and apparatus that can detect signal disturbances having a duration longer than would be present in an impulse disturbance or spike. When such a condition is encountered, an indication of a shift fault in that channel may be output. Example embodiments of the invention can provide the further technical effects of providing systems, methods, and apparatus for inhibiting shift detection for simplex redundancy.

In example embodiments of the inventions, the fault detection, isolation, and remediation system 100, the processing system 200, the spike detector 300, the shift detector 400, the noise/stuck detector 500, the drift detector 600, the agreement detector 700, the combined confidence system 800 the remediation system 900, the snap smoother 1000, and the agreement detector 1200 may include any number of hardware and/or software applications that are executed to facilitate any of the operations.

In example embodiments, one or more I/O interfaces may facilitate communication between the fault detection, isolation, and remediation system 100, the processing system 200, the spike detector 300, the shift detector 400, the noise/stuck detector 500, the drift detector 600, the agreement detector 700, the combined confidence calculation 800, the remediation system 900, the snap smoother 1000, the agreement detector 1200, and one or more input/output devices. For example, a universal serial bus port, a serial port, a disk drive, a CD-ROM drive, and/or one or more user interface devices, such as a display, keyboard, keypad, mouse, control panel, touch screen display, microphone, etc., may facilitate user interaction with the fault detection, isolation, and remediation system 100, the processing system 200, the spike detector 300, the shift detector 400, the noise/stuck detector 500, the drift detector 600, the agreement detector 700, the combined confidence calculation 800, the remediation system 900, the snap smoother 1000, and the agreement detector 1200. The one or more I/O interfaces may be utilized to receive or collect data and/or user instructions from a wide variety of input devices. Received data may be processed by one or more computer processors as desired in various embodiments of the invention and/or stored in one or more memory devices.

One or more network interfaces may facilitate connection of the fault detection, isolation, and remediation system 100, the processing system 200, the spike detector 300, the shift detector 400, the noise/stuck detector 500, the drift detector 600, the agreement detector 700, the combined confidence calculation 800, the remediation system 900, the snap smoother 1000, and the agreement detector 1200 inputs and outputs to one or more suitable networks and/or connections. For example, the connections may facilitate communication with any number of sensors associated with the system. The one or more network interfaces may further facilitate connection to one or more suitable networks; for example, a local area network, a wide area network, the Internet, a cellular network, a radio frequency network, a Bluetooth™ (owned by Telefonaktiebolaget LM Ericsson) enabled network, a Wi-Fi™ (owned by Wi-Fi Alliance) enabled network, a satellite-based network, any wired network, any wireless network, etc., for communication with external devices and/or systems.

As desired, embodiments of the invention may include the fault detection, isolation, and remediation system 100, the processing system 200, the spike detector 300, the shift detector 400, the noise/stuck detector 500, the drift detector 600, the agreement detector 700, the combined confidence calculation 800, the remediation system 900, the snap smoother 1000, and the agreement detector 1200 with more or less of the components illustrated in FIGS. 1 through 12.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer-usable medium having a computer-readable program code or program instructions embodied therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special-purpose hardware and computer instructions.

While the invention has been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose the invention, including the best mode, and also to enable any person skilled in the art to practice the invention, including making and using any devices or systems and performing any incorporated methods. The patentable scope of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

PARTS LIST 100 fault detection, isolation, and remediation system block diagram
102 sensors
104 detection and confidence determination blocks
106 combined confidence calculator block
108 remediator block
110 specific fault status
112 remediated value
114 protective logicals
116 sensor A
118 sensor B
120 sensor C
122 sensor model (M)
124 availability status (AST)
126 spike detector
128 shift detector
130 stuck detector
132 noise detector
134 agreement detector
136 drift detector
138 confidences A (AST, spike . . . )
140 confidences B (AST, spike . . . )
142 confidences C (AST, spike . . . )
144 combined A confidence
146 combined B confidence
148 combined C confidence
200 processing system block diagram
202 controller
204 memory
206 processor(s)
208 input/output interface
210 network interface
212 operating system
214 data
216 sensors
218 input/output human interface device
220 sensor model
222 fault detector
224 confidence module
226 remediator/accommodator
300 spike detector block diagram
302 sensor sample (value)
303 current sample.
305 previous sample
306 difference block
307 difference
308 absolute value
309 difference magnitude
310 greater that evaluation block
311 single sample delay
312 spike threshold
313 switch
315 output (impulse-free)
317 spike detected (indicator)
318 false to true delay
320 pickup time delay
322 or gate
324 initialization input
326 shift confidence (also see 414)
328 spike confidence
332 protective logicals
400 shift detector block diagram
402 spike confidence
404 channel closeness signal
406 true to false delay (drop out delay)
408 AND block
410 latch
411 channel closeness attribute signal
412 inverter
414 shift confidence
416 protective logicals
418 dropout delay
420 sensors no longer close (or out of range)
422 channel closeness attribute false
424 channels close again
426 pickup delay (greater or equal than spike duration)
428 channel closeness attribute true
500 noise/stuck detector block diagram
501 sensor
502 sensor signal samples (without spikes)
504 standard deviation estimator
506 divide block
508 expected standard deviation value (trained)
510 noise interpolator
512 stuck interpolator
513 delay with first order lag filter
514 noise confidence
516 protective logicals
518 noise confidence
520 protective logicals
600 drift detector block diagram
602 sensor input
604 frequency separator 1
606 frequency separator 2
608 frequency separator 3
610 frequency separator 4
612 subtraction block 1
614 subtraction block 2
616 subtraction block 3
618 drift gate determination 1
620 drift gate determination 2
622 drift gate determination 3
624 min
626 drift confidence
628 protective logicals
700 agreement detector block diagram
702 abs (A-B), A and B represent different channels in (A, B, C)
704 agreement threshold (gate, sensitivity)
706 de-bounce delay (hysteresis)
708 agreement process
709 pair-wise agreement
710 first and gate
712 A available
714 B available
716 second and gate
718 A disagrees with C
720 all sensor disagreement
722 latch
724 A close to B or C
726 third and gate
728 forth and gate
732 model invalid
734 model valid
736 first switch
738 second switch
740 all channel agreement confidence
742 true
744 second OR gate
746 |A−M|<|B−M| (M=model) (A closest to model)
748 B not available
750 A and B are close 752 first OR gate
754 |A−|<|C−M| (M=model) (A closest to model)
756 C not available
758 A and C are close
760 third switch
762 A not available
764 Min of |A−M|, |B−M|, |C−M| (Channel closest match to model)
766 fourth switch
800 combined confidence calculation block diagram
802 min selection
804 noise confidence
806 drift confidence
810 spike confidence
812 shift confidence
814 agreement confidence
816 in-range confidence
818 analog conversion 1
820 analog conversion 2
822 analog conversion 3
824 analog conversion 4
826 history block
828 non-linear transformer
830 integrator
832 second min select block
834 combined confidence
900 remediation system block diagram
902 sensor A
904 sensor B
906 sensor C
908 median block
909 median data
910 weighted average block
911 weighted average
912 confidence A
914 confidence B
916 confidence C
918 >low confidence A
920 >low confidence B
922 >low confidence C
924 summing block
926 <1
928 protective logicals
930 =3
932 switch
934 only C available
936 switch
938 only B available
940 switch
942 only A available
944 switch
946 switch
948 model value
950 switch
952 default value
954 first AND gate
956 second AND gate
958 model valid
960 accommodated value
962 snap smoother
1000 snap smoother block diagram
1002 confidence A
1004 confidence B
1006 confidence C
1008 <low confidence A
1010 <low confidence B
1012 <low confidence C
1014 one sample delay
1016 one sample delay
1018 one sample delay
1020 xor
1022 xor
1024 xor
1028 OR
1030 programmable delay
1032 filtration period
1034 divide
1036 filtration coefficient
1040 bypass input
1042 smoothed value
1044 normal output
1100 standard deviation estimator block diagram
1102 sensor signal samples
1104 time index
1106 regression extrapolator
1108 least squares approximation block
1110 regression coefficients
1112 time advance
1114 linear regression block
1116 predicted sensor signal values
1118 difference junction
1120 absolute value block
1122 low pass filter
1124 estimate of standard deviation
1200 agreement detector block diagram
1202 1 or less channels available (condition 2)
1204 initialization
1206 model valid
1208 hi difference between pairs (condition 3)
1210 pair-wise disagreement between non-outlier sensor channels (condition 5)
1212 pair-wise agreement (condition 1)
1214 not
1216 not
1218 and
1220 or
1222 latch
1224 not
1226 channel agreement confident
1300 method
1302 block
1304 block
1306 block
1308 block
1400 method
1402 block
1404 block
1406 block
1500 method
1502 block
1504 block
1506 block
1508 block
1510 block
1600 method
1602 block
1604 block
1606 block
1608 block
1700 method
1702 block
1704 block
1706 block
1800 method 1802 block
1804 block
1806 block
1900 method
1902 block
1904 block
1906 block
1908 block
1910 block
2000 method
2002 block
2004 block
2006 block
2008 block
2010 block
2012 block

The invention claimed is:

1. A method for detecting and indicating a shift in redundant sensor signals, comprising:
   receiving a sensor channel closeness signal for two or more redundant sensors;
   receiving a spike confidence signal for at least one of the two or more redundant sensors;
   receiving a spike duration signal for the at least one of the two or more redundant sensors;
   determining a shift confidence based at least in part on the received sensor channel closeness signal, the received spike confidence signal, and the received spike duration signal; and
   outputting the shift confidence, wherein the outputting of the shift confidence comprises logical multiplication of an inverted spike confidence signal and a channel closeness attribute, wherein the channel closeness attribute comprises a channel closeness signal delayed for a predetermined time defined by the spike duration signal, and wherein an output of the logical multiplication sets a latch, and wherein the latch is reset by the channel closeness signal being true, and wherein an output of the latch is inverted and interpreted as the shift confidence.

2. The method of claim 1, wherein determining the shift confidence comprises determining a valid shift in a sensor signal when:
   the received spike confidence signal indicates no detected impulse disturbance;
   the received sensor channel closeness signal initially indicates whether channel differences for the two or more redundant sensors are within a predefined range; and
   the received sensor channel closeness signal indicates whether the channel differences for the two or more redundant sensors are not within the predefined range after a period of time defined by the spike duration signal.

3. The method of claim 2, wherein the predefined range comprises about 0.1% to about 10% of full scale.

4. The method of claim 1, wherein receiving the spike confidence signal is based at least in part on detecting a difference magnitude between a current sample and a previous sample associated with the at least one of the two or more redundant sensors, and wherein the difference magnitude is greater than a predetermined threshold value.

5. The method of claim 1, wherein outputting the shift confidence further comprises inhibiting the shift confidence for non-redundant channels.

6. A system for detecting and indicating a shift in redundant sensor signals, comprising:
   one or more sensors;
   at least one memory for storing data and computer-executable instructions;
   at least one processor configured to access the at least one memory and further configured to execute the computer-executable instructions for:
      receiving a sensor channel closeness signal for two or more redundant sensors;
      receiving a spike confidence signal for at least one of the two or more redundant sensors;
      receiving a spike duration signal for the at least one of the two or more redundant sensors;
      determining a shift confidence based at least in part on the received sensor channel closeness signal, the received spike confidence signal, and the received spike duration signal; and
      outputting the shift confidence, wherein the outputting of the shift confidence comprises logical multiplication of an inverted spike confidence signal and a channel closeness attribute, wherein the channel closeness attribute comprises a channel closeness signal delayed for a predetermined time defined by the spike duration signal, and wherein an output of the logical multiplication sets a latch, and wherein the latch is reset by the channel closeness signal being true, and wherein an output of the latch is inverted and interpreted as the shift confidence.

7. The system of claim 6 wherein the at least one processor is further configured for determining the shift confidence, wherein the shift confidence indicates a valid shift in a sensor signal when:
   the received spike confidence signal indicates no detected impulse disturbance;
   the received sensor channel closeness signal initially indicates whether channel differences for the two or more redundant sensors are within a predefined range; and
   the received sensor channel closeness signal indicates whether the channel differences for the two or more redundant sensors are not within the predefined range after a period of time defined by the spike duration signal.

8. The system of claim 7, wherein the predefined range comprises about 0.1% to about 10% of full scale.

9. The system of claim 6, wherein the at least one processor is further configured for receiving the spike confidence signal based at least in part on detecting a difference magnitude between a current sample and a previous sample associated with the at least one of the two or more redundant sensors, and wherein the difference magnitude is greater than a predetermined threshold value.

10. The system of claim 6, wherein outputting the shift confidence further comprises inhibiting the shift confidence for non-redundant channels.

11. The system of claim 6, wherein the at least one processor is further configured for outputting one or more protective logicals based at least in part on the shift confidence.

12. An apparatus for detecting and indicating a shift in redundant sensor signals, comprising:
   at least one memory for storing data and computer-executable instructions;
   at least one processor configured to access the at least one memory and further configured to execute the computer-executable instructions for:
      receiving a sensor channel closeness signal for two or more redundant sensors;

receiving a spike confidence signal for at least one of the two or more redundant sensors;

receiving a spike duration signal for the at least one of the two or more redundant sensors;

determining a shift confidence based at least in part on the received sensor channel closeness signal, the received spike confidence signal, and the received spike duration signal; and outputting the shift confidence, wherein the outputting of the shift confidence comprises logical multiplication of an inverted spike confidence signal and a channel closeness attribute, wherein the channel closeness attribute comprises a channel closeness signal delayed for a predetermined time defined by the spike duration signal, and wherein an output of the logical multiplication sets a latch, and wherein the latch is reset by the channel closeness signal being true, and wherein an output of the latch is inverted and interpreted as the shift confidence.

13. The apparatus of claim 12 wherein the at least one processor is further configured for determining the shift confidence, wherein the shift confidence indicates a valid shift in a sensor signal when:

the received spike confidence signal indicates no detected impulse disturbance;

the received sensor channel closeness signal initially indicates whether channel differences for the two or more redundant sensors are within a predefined range; and the received sensor channel closeness signal indicates whether the channel differences for the two or more redundant sensors are not within the predefined range after a period of time defined by the spike duration signal.

14. The apparatus of claim 13, wherein the predefined range comprises about 0.1% to about 10% of full scale.

15. The apparatus of claim 12, wherein the at least one processor is further configured for receiving the spike confidence signal based at least in part on detecting a difference magnitude between a current sample and a previous sample associated with the at least one of the two or more redundant sensors, and wherein the difference magnitude is greater than a predetermined threshold value.

16. The apparatus of claim 12, wherein outputting the shift confidence further comprises inhibiting the shift confidence for non-redundant channels.

17. The apparatus of claim 12, wherein the at least one processor is further configured for outputting one or more protective logicals based at least in part on the shift confidence.

* * * * *